(12) United States Patent
Huang

(10) Patent No.: US 12,176,342 B2
(45) Date of Patent: *Dec. 24, 2024

(54) METHOD FOR FABRICATING SEMICONDUCTOR DEVICE WITH GUARD RING

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 414 days.

This patent is subject to a terminal disclaimer.

(21) Appl. No.: 17/830,723

(22) Filed: Jun. 2, 2022

(65) Prior Publication Data

US 2023/0395594 A1    Dec. 7, 2023

(51) Int. Cl.
*H01L 29/06* (2006.01)
*H01L 27/02* (2006.01)

(52) U.S. Cl.
CPC ...... *H01L 27/0292* (2013.01); *H01L 29/0619* (2013.01); *H01L 29/0623* (2013.01); *H01L 2924/16152* (2013.01)

(58) Field of Classification Search
CPC ............. H01L 29/0619; H01L 29/0623; H01L 27/0292; H01L 2924/16152; H01L 29/7811; H01L 29/7813; H01L 29/407; H01L 29/4236; H01L 29/402; H01L 29/063; H01L 29/0634; H01L 29/66348
See application file for complete search history.

(56) References Cited

U.S. PATENT DOCUMENTS

| 8,564,058 | B1* | 10/2013 | Hsieh | H01L 29/7813 |
| | | | | 257/334 |
| 9,530,882 | B1* | 12/2016 | Hsieh | H01L 29/7811 |
| 9,768,253 | B2* | 9/2017 | Hoki | H01L 29/7395 |
| 9,887,287 | B1* | 2/2018 | Lichtenwalner | H01L 29/1095 |
| 11,532,737 | B2* | 12/2022 | Kato | H01L 29/0615 |

(Continued)

FOREIGN PATENT DOCUMENTS

| TW | 202137478 A | 10/2021 |
| TW | 202209681 A | 3/2022 |

*Primary Examiner* — Maliheh Malek
(74) *Attorney, Agent, or Firm* — MUNCY, GEISSLER, OLDS & LOWE, P.C.

(57) ABSTRACT

The present disclosure provides a method for fabricating a semiconductor device including: forming an isolation layer in a substrate to define a first surrounding area surrounding a center area and a second surrounding area surrounding the first surrounding area in a top-view perspective; forming a first guard ring in the first surrounding area; forming a second guard ring in the second surrounding area; and forming a programmable unit in the center area. Forming the programmable unit includes: forming a middle insulating layer in the center area and including a U-shaped cross-sectional profile; forming a first electrode including a common layer on two sides of the middle insulating layer, and forming a connection layer including a U-shaped cross-sectional profile on the two sides and the bottom surface of the middle insulating layer; and forming a second electrode layer on an inner surface of the middle insulating layer.

21 Claims, 34 Drawing Sheets

(56) References Cited

U.S. PATENT DOCUMENTS

| | | | | |
|---|---|---|---|---|
| 2002/0185705 | A1* | 12/2002 | Saitoh | H01L 29/7816 |
| | | | | 257/E29.066 |
| 2011/0256685 | A1* | 10/2011 | Suzuki | H01L 21/0331 |
| | | | | 257/E21.011 |
| 2012/0025263 | A1* | 2/2012 | Yamaguchi | H01L 29/1095 |
| | | | | 257/E29.066 |
| 2012/0292712 | A1* | 11/2012 | Baek | H01L 27/088 |
| | | | | 257/E27.06 |
| 2013/0313635 | A1* | 11/2013 | Nakano | H01L 29/0619 |
| | | | | 257/330 |
| 2014/0077284 | A1* | 3/2014 | Akiyama | H01L 27/0629 |
| | | | | 257/302 |
| 2015/0380503 | A1* | 12/2015 | Nakano | H01L 29/2003 |
| | | | | 257/77 |
| 2016/0079356 | A1* | 3/2016 | Magrí | H01L 29/66734 |
| | | | | 438/270 |
| 2017/0084693 | A1* | 3/2017 | Hoki | H01L 29/0684 |
| 2017/0213908 | A1* | 7/2017 | Fursin | H01L 29/407 |
| 2017/0317207 | A1* | 11/2017 | Hsieh | H01L 29/7811 |
| 2018/0108737 | A1* | 4/2018 | Naito | H01L 29/8613 |
| 2018/0166530 | A1* | 6/2018 | Lichtenwalner | H01L 21/046 |
| 2019/0019861 | A1* | 1/2019 | Naito | H01L 27/0664 |
| 2019/0051739 | A1* | 2/2019 | Naito | H01L 29/36 |
| 2021/0151598 | A1* | 5/2021 | Seok | H01L 29/7811 |
| 2021/0343834 | A1* | 11/2021 | Lichtenwalner | H01L 29/1608 |
| 2022/0406943 | A1* | 12/2022 | Kawara | H01L 23/49562 |
| 2023/0052714 | A1* | 2/2023 | Chou | H01L 29/0623 |
| 2023/0170383 | A1* | 6/2023 | Kim | H01L 29/66712 |
| | | | | 257/494 |
| 2023/0223470 | A1* | 7/2023 | Hayashi | H01L 29/0615 |
| | | | | 257/77 |
| 2023/0395710 | A1* | 12/2023 | Tega | H01L 29/0623 |
| 2024/0096965 | A1* | 3/2024 | Mitsuzuka | H01L 29/1095 |
| 2024/0170569 | A1* | 5/2024 | Okumura | H01L 29/4238 |
| 2024/0170570 | A1* | 5/2024 | Uchida | H01L 29/7813 |

* cited by examiner

METHOD FOR FABRICATING SEMICONDUCTOR DEVICE WITH GUARD RING

TECHNICAL FIELD

The present disclosure relates to a method for fabricating a semiconductor device, and more particularly, to a method for fabricating a semiconductor device with a guard ring.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including an isolation layer positioned in a substrate to define a first surrounding area surrounding a center area in a top-view perspective; a first guard ring positioned in the first surrounding area; and a programmable unit including: a middle insulating layer positioned in the center area and including a U-shaped cross-sectional profile; a first electrode including a common layer positioned on two sides of the middle insulating layer, and a connection layer including a U-shaped cross-sectional profile, positioned on the two sides and the bottom surface of the middle insulating layer, and connecting to the common layer; and a second electrode layer positioned on an inner surface of the middle insulating layer. A bottom surface of the common layer is at a vertical level greater than a vertical level of a bottom surface of the middle insulating layer. The first guard ring and the first electrode include opposite electrical types.

Another aspect of the present disclosure provides a semiconductor device including an isolation layer positioned in a substrate to define a first surrounding area surrounding a center area and a second surrounding area surrounding the first surrounding area in a top-view perspective; a first guard ring positioned in the first surrounding area; a second guard ring positioned in the second surrounding area; a programmable unit including: a middle insulating layer positioned in the center area and including a U-shaped cross-sectional profile; a first electrode including a common layer positioned on two sides of the middle insulating layer, and a connection layer including a U-shaped cross-sectional profile, positioned on the two sides and the bottom surface of the middle insulating layer, and connecting to the common layer; and a second electrode layer positioned on an inner surface of the middle insulating layer. A bottom surface of the common layer is at a vertical level greater than a vertical level of a bottom surface of the middle insulating layer. The first guard ring and the first electrode include opposite electrical types, and the first guard ring and the second guard ring include opposite electrical types.

Another aspect of the present disclosure provides a method for fabricating a semiconductor device including forming an isolation layer in a substrate to define a first surrounding area surrounding a center area and a second surrounding area surrounding the first surrounding area in a top-view perspective; forming a first guard ring in the first surrounding area; forming a second guard ring in the second surrounding area; and forming a programmable unit in the center area and including: a middle insulating layer in the center area and including a U-shaped cross-sectional profile; a first electrode including a common layer on two sides of the middle insulating layer, wherein a bottom surface of the common layer is at a vertical level greater than a vertical level of a bottom surface of the middle insulating layer, and a connection layer including a U-shaped cross-sectional profile, on the two sides and the bottom surface of the middle insulating layer, and connecting to the common layer; and a second electrode layer on an inner surface of the middle insulating layer. The first guard ring and the first electrode include opposite electrical types, and the first guard ring and the second guard ring include opposite electrical types.

Due to the design of the semiconductor device of the present disclosure, the first guard ring and the second guard ring may provide capability of electrostatic discharge to the plurality of programmable units. As a result, the reliability and performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
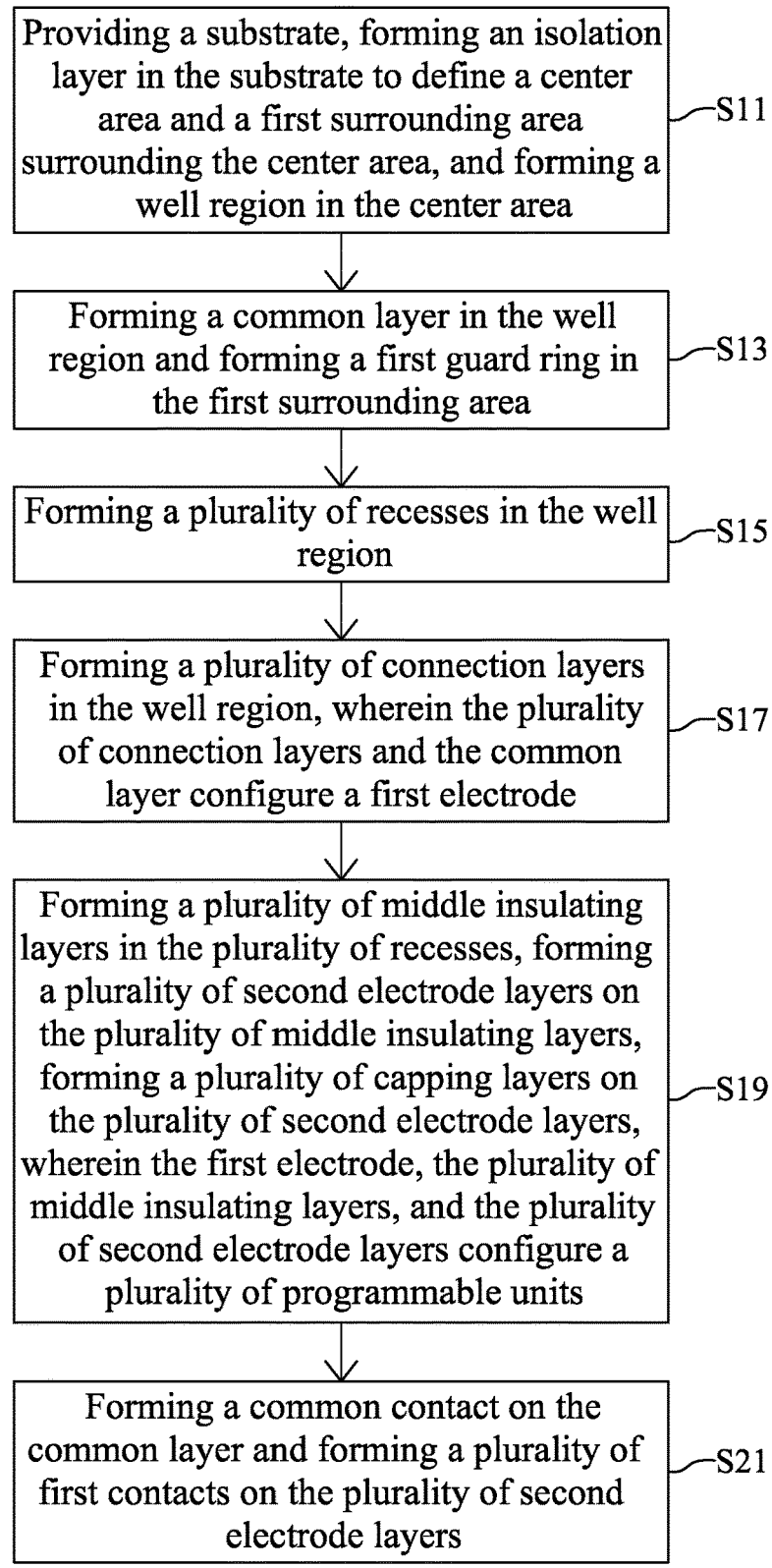
FIG. 1 illustrates, in a flowchart diagram form, a method 10 for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

Figure 2:
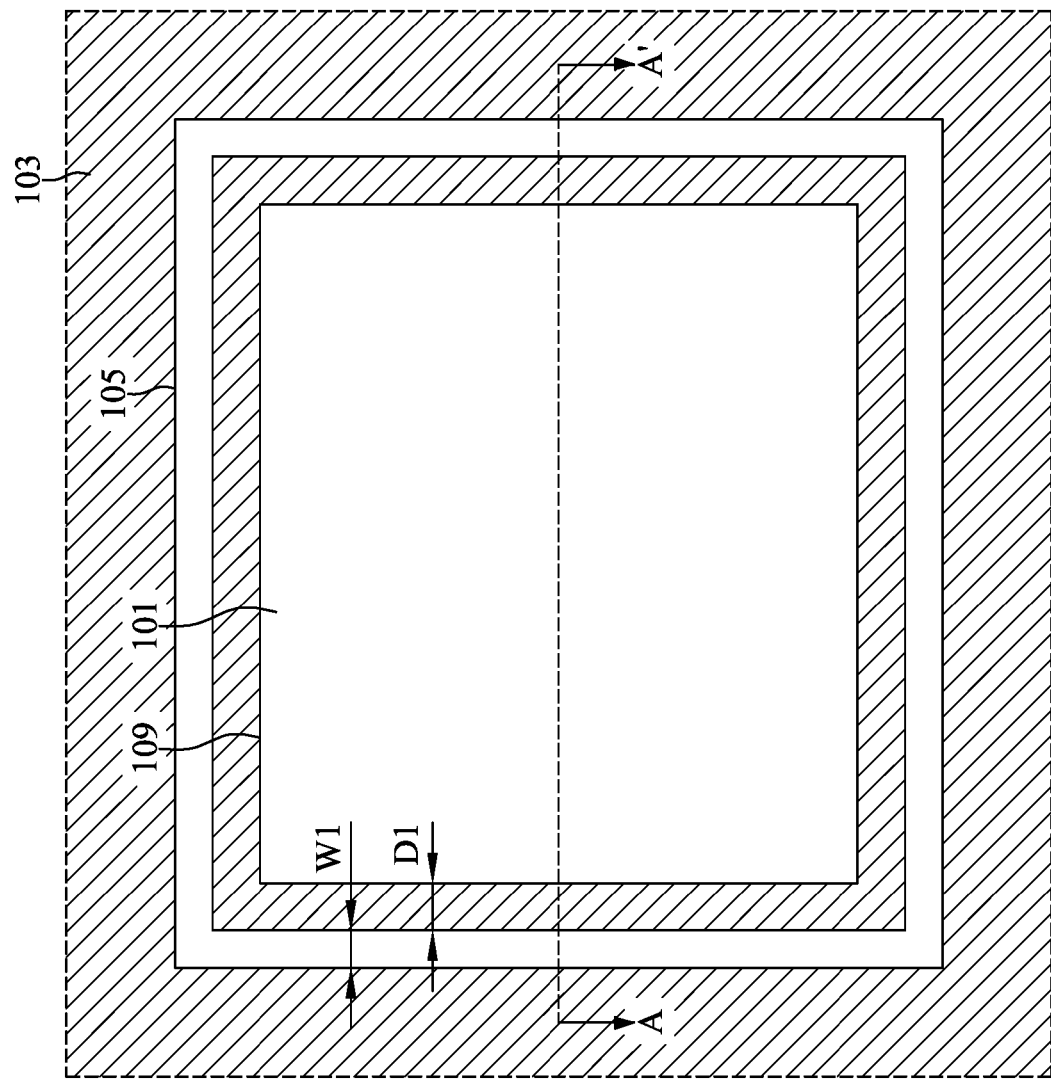
FIG. 2 illustrates, in a schematic top-view diagram, an intermediate semiconductor device in accordance with one embodiment of the present disclosure.
Figure 3:
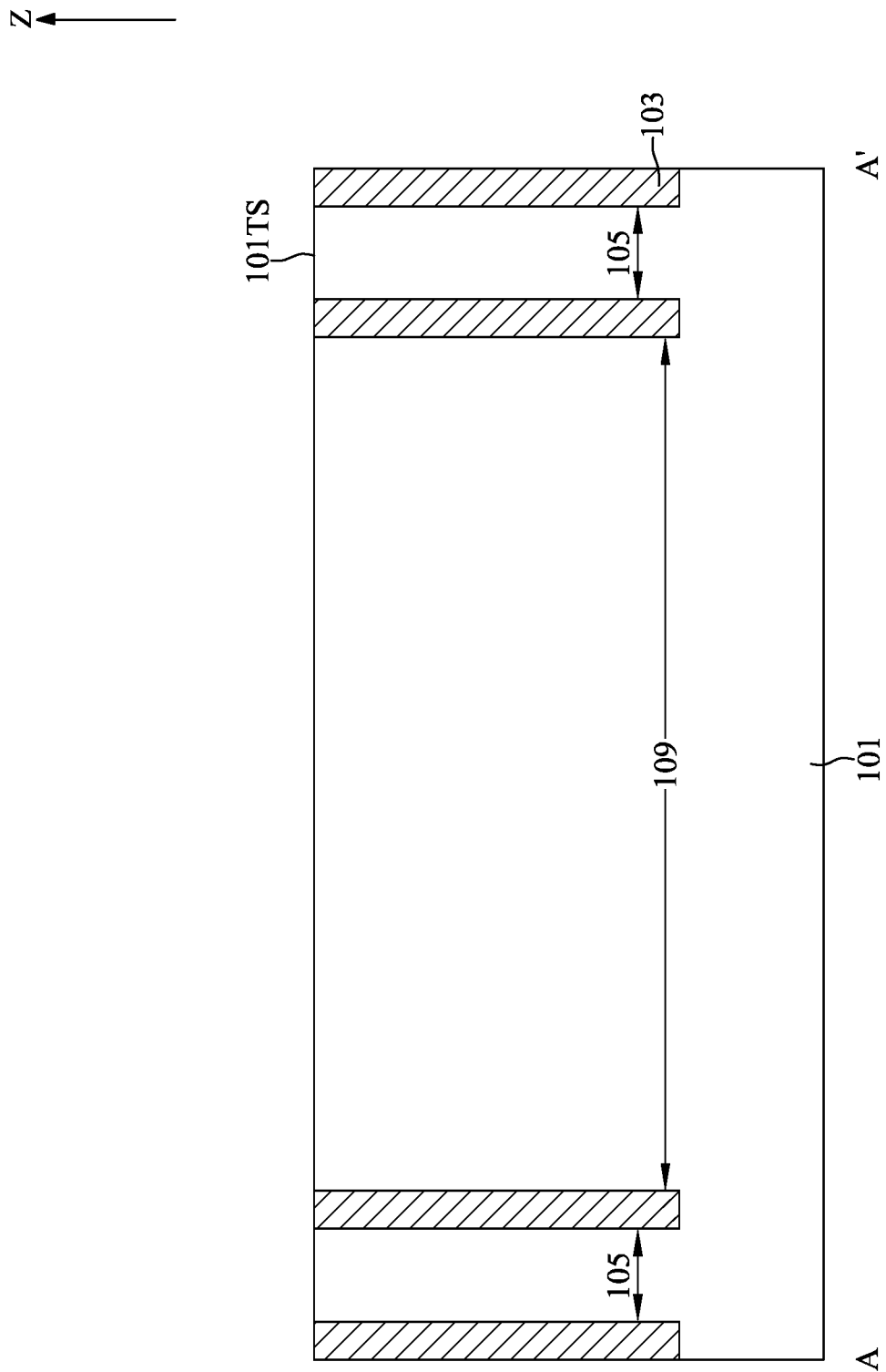
FIG. 3 is a schematic cross-sectional view diagram taken along a line A-A' in FIG. 2.
Figure 4:
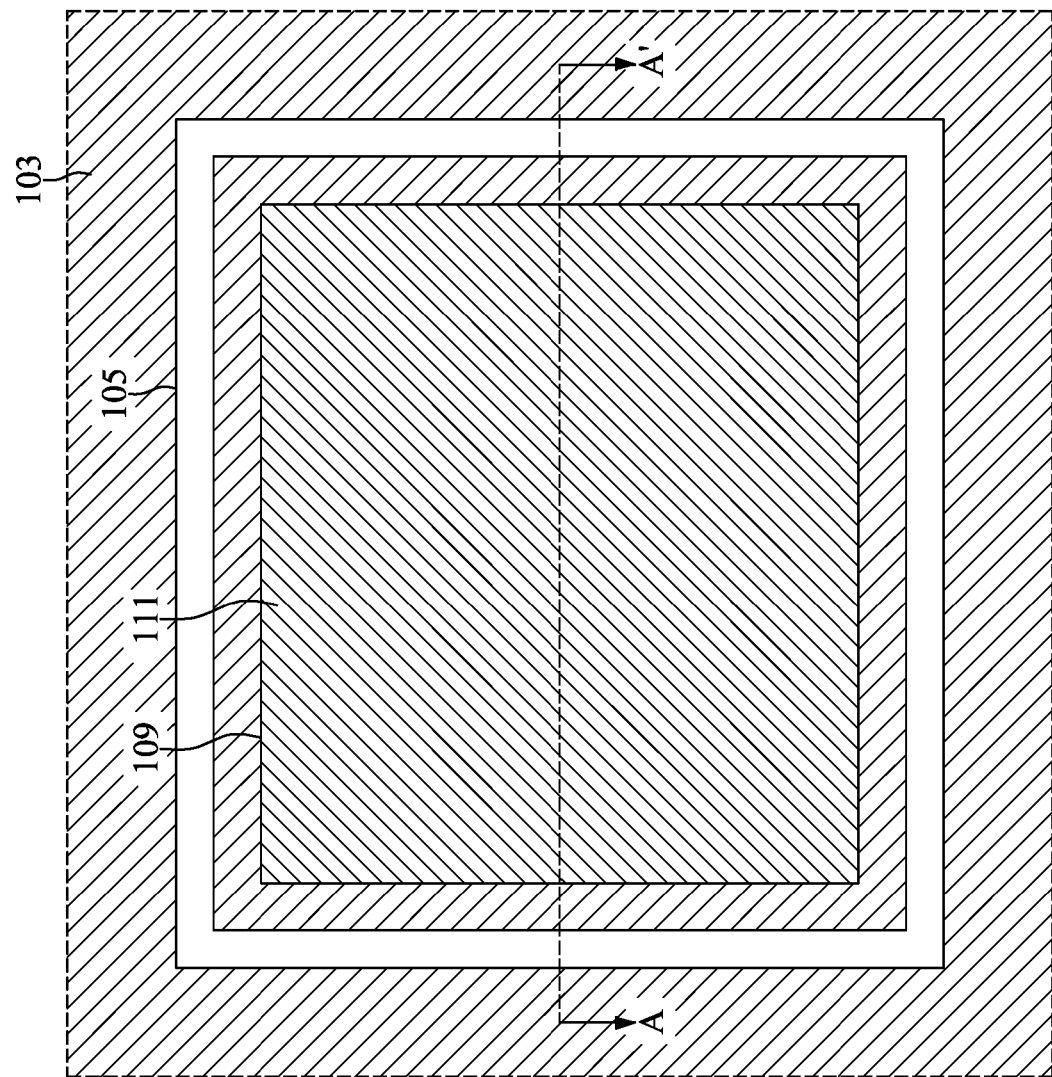
FIG. 4 illustrates, in a schematic top-view diagram, an intermediate semiconductor device in accordance with one embodiment of the present disclosure.
Figure 5:
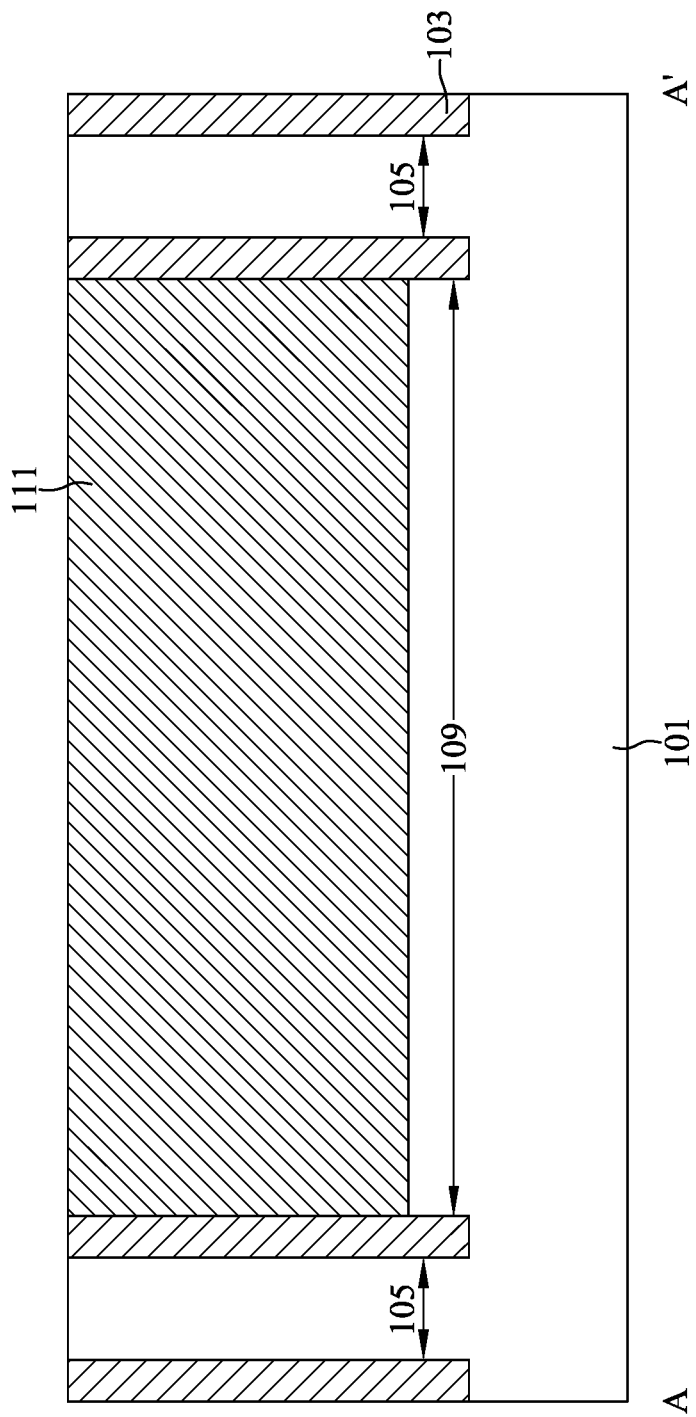
FIG. 5 is a schematic cross-sectional view diagram taken along a line A-A' in FIG. 4.

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along a line A-A' in FIG. 2. FIG. 4 illustrates, in a schematic top-view diagram, an intermediate semiconductor device in accordance with one embodiment of the present disclosure. FIG. 5 is a schematic cross-sectional view diagram taken along a line A-A' in FIG. 4.

With reference to FIGS. 1 to 5, at step S11, a substrate 101 may be provided, an isolation layer 103 may be formed in the substrate 101 to define a center area 109 and a first surrounding area 105 surrounding the center area 109, and a well region 111 may be formed in the center area 109.

With reference to FIGS. 2 and 3, the substrate 101 may be a bulk semiconductor substrate. The bulk semiconductor substrate may be formed of, for example, an elementary semiconductor such as silicon or germanium or a compound semiconductor such as silicon germanium, silicon carbide, gallium arsenide, gallium phosphide, indium phosphide, indium arsenide, indium antimonide, or other III-V compound semiconductor or II-VI compound semiconductor.

With reference to FIGS. 2 and 3, a series of deposition processes may be performed to deposit a pad oxide layer (not shown) and a pad nitride layer (not shown) on the substrate 101. A mask layer (not shown) including the pattern of the isolation layer 103 may be formed on the pad nitride layer. An etch process, such as an anisotropic dry etch process, may be performed to form trenches along the pad oxide layer, the pad nitride layer, and extending to the substrate 101. An insulating material may be deposited into the trenches and a planarization process, such as chemical mechanical polishing, may be subsequently performed until the top surface 101TS of the substrate 101 is exposed to remove excess filling material, provide a substantially flat surface for subsequent processing steps, and concurrently form the isolation layer 103. The insulating material may be, for example, silicon oxide, silicon nitride, silicon oxynitride, silicon nitride oxide, or fluoride-doped silicate.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 2 and 3, the isolation layer 103 may define the center area 109 and the first surrounding area 105. In some embodiments, the center area 109 may be square or rectangle in a top-view perspective but is not limited thereto. In some embodiments, the width W1 of the first surrounding area 105 and the distance D1 between the first surrounding area 105 and the center area 109 may be substantially the same. In some embodiments, the width W1 of the first surrounding area 105 and the distance D1 between the first surrounding area 105 and the center area 109 may be different. For example, the width W1 of the first surrounding area 105 may be greater than or less than the distance D1 between the first surrounding area 105 and the center area 109.

It should be noted that the center area 109 may comprise a portion of the substrate 101 and a space above the portion of the substrate 101. Describing an element as being disposed on the center area 109 means that the element is disposed on a top surface of the portion of the substrate 101. Describing an element as being disposed in the center area 109 means that the element is disposed in the portion of the substrate 101; however, a top surface of the element may be even with the top surface of the portion of the substrate 101. Describing an element as being disposed above the center area 109 means that the element is disposed above the top surface of the portion of the substrate 101. Accordingly, the first surrounding area 105 may be another portion of the substrate 101.

It should be noted that, in the description of the present disclosure, a surface of an element (or a feature) located at the highest vertical level along the dimension Z is referred to as a top surface of the element (or the feature). A surface of an element (or a feature) located at the lowest vertical level along the dimension Z is referred to as a bottom surface of the element (or the feature).

With reference to FIGS. 4 and 5, a mask layer (not shown) may be formed on the substrate 101 to expose the center area 109. An implantation process may be performed to dope the center area 109 with p-type dopants or n-type dopants. After the implantation process, the well region 111 may be formed in the center area 109. The well region 111 may have a first electrical type. It should be noted that the term "electrical type" denotes a doped region being p-type or n-type. In the present embodiment, the first electrical type of the well region 111 may be p-type. After the implantation process, the mask layer may be removed.

The term "p-type dopant" refers to an impurity that when added to an intrinsic semiconductor material creates deficiencies of valence electrons. In a silicon containing semiconductor material, examples of p-type dopants include, but are not limited to, boron, aluminum, gallium or indium. The term "n-type dopant" refers to an impurity that when added to an intrinsic semiconductor material contributes free electrons to the intrinsic semiconductor material. In a silicon-containing material, examples of n-type dopants include, but are not limited to, antimony, arsenic or phosphorus.

In some embodiments, an anneal process may be performed to activate the well region 111. The temperature of the anneal process may be between about 800° C. and about 1250° C. The anneal process may have a process duration between about 1 millisecond and about 500 milliseconds. The anneal process may be, for example, a rapid thermal anneal, a laser spike anneal, or a flash lamp anneal.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Figure 6:
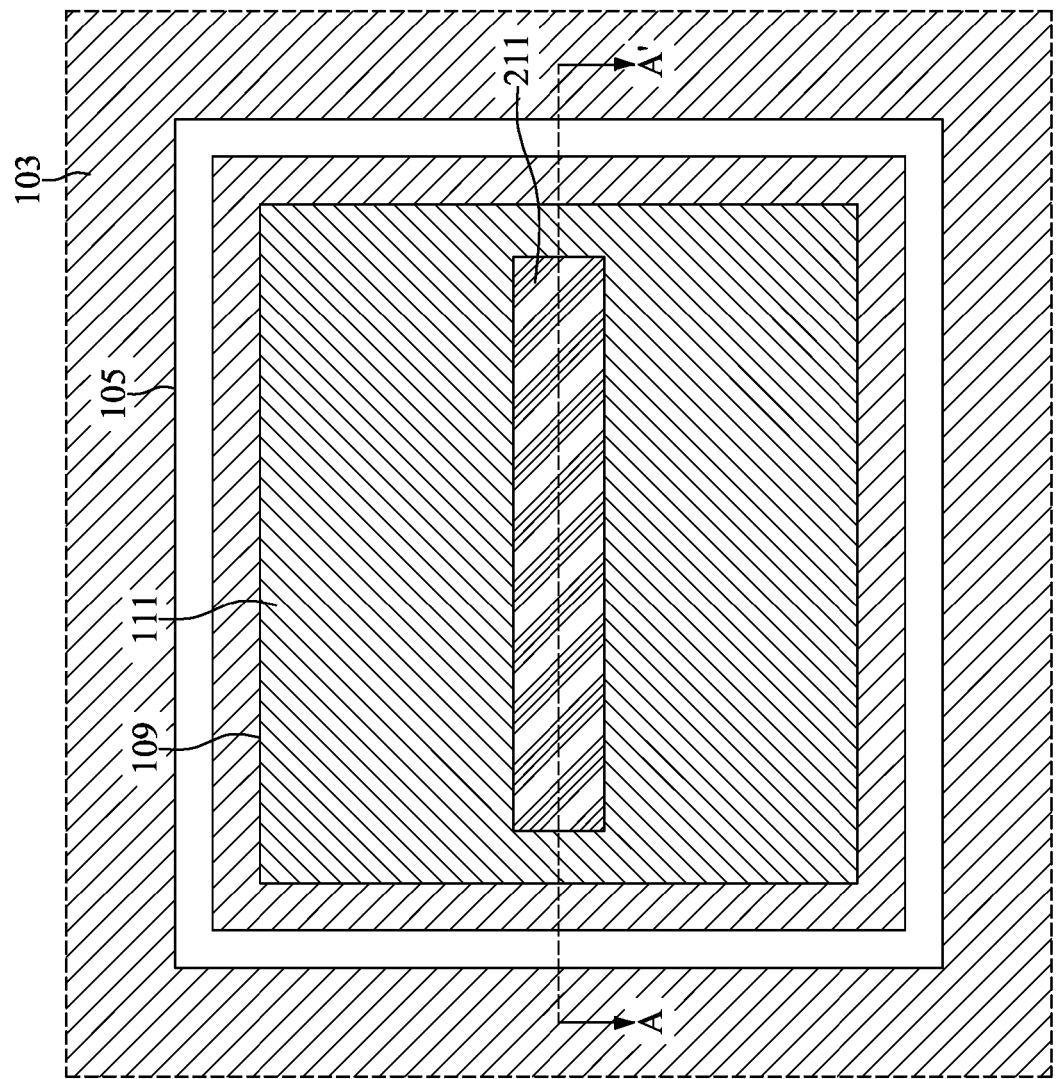
FIG. 6 illustrates, in a schematic top-view diagram, an intermediate semiconductor device in accordance with one embodiment of the present disclosure.
Figure 7:
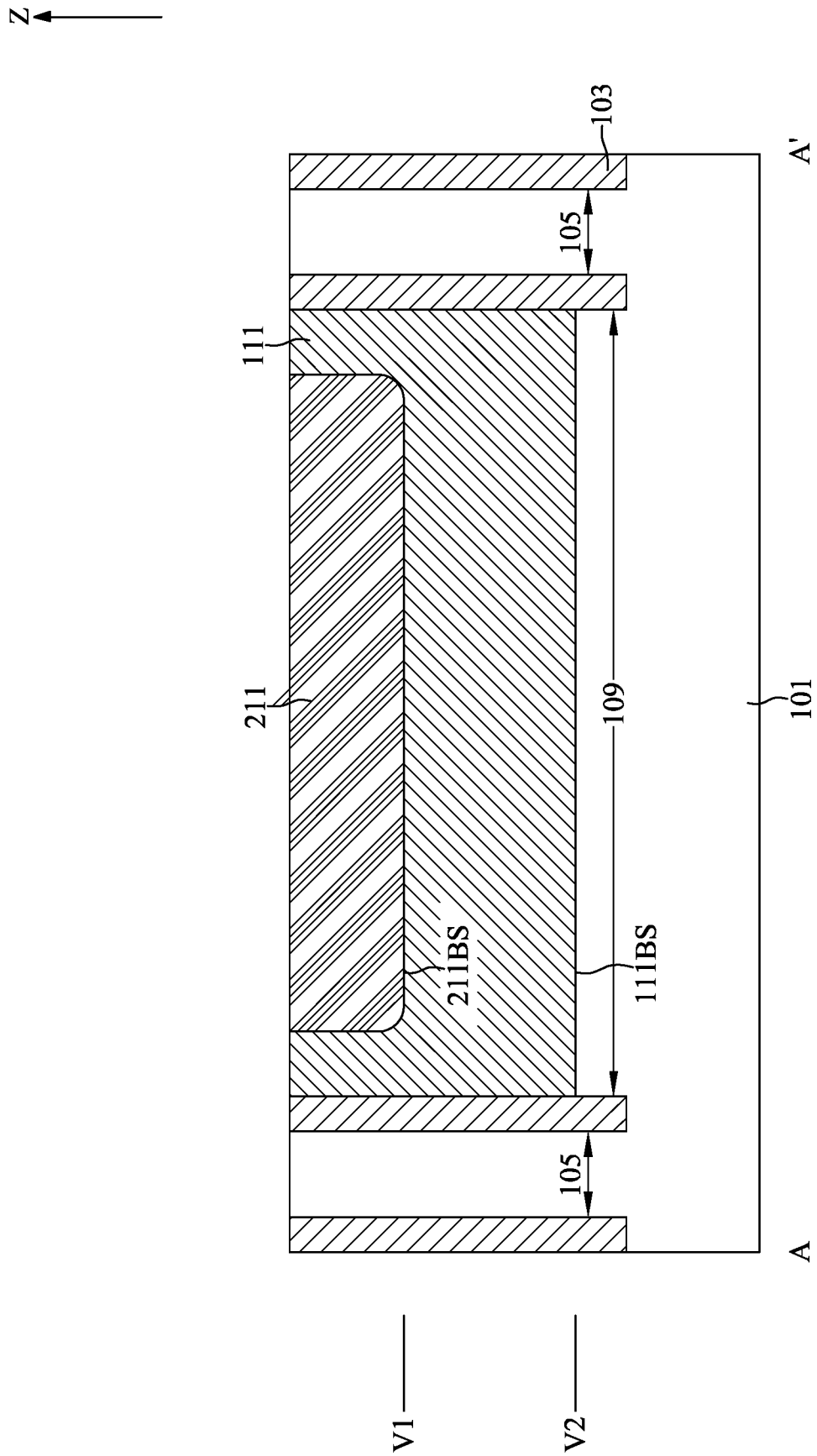
FIG. 7 is a schematic cross-sectional view diagram taken along a line A-A' in FIG. 6.
Figure 8:
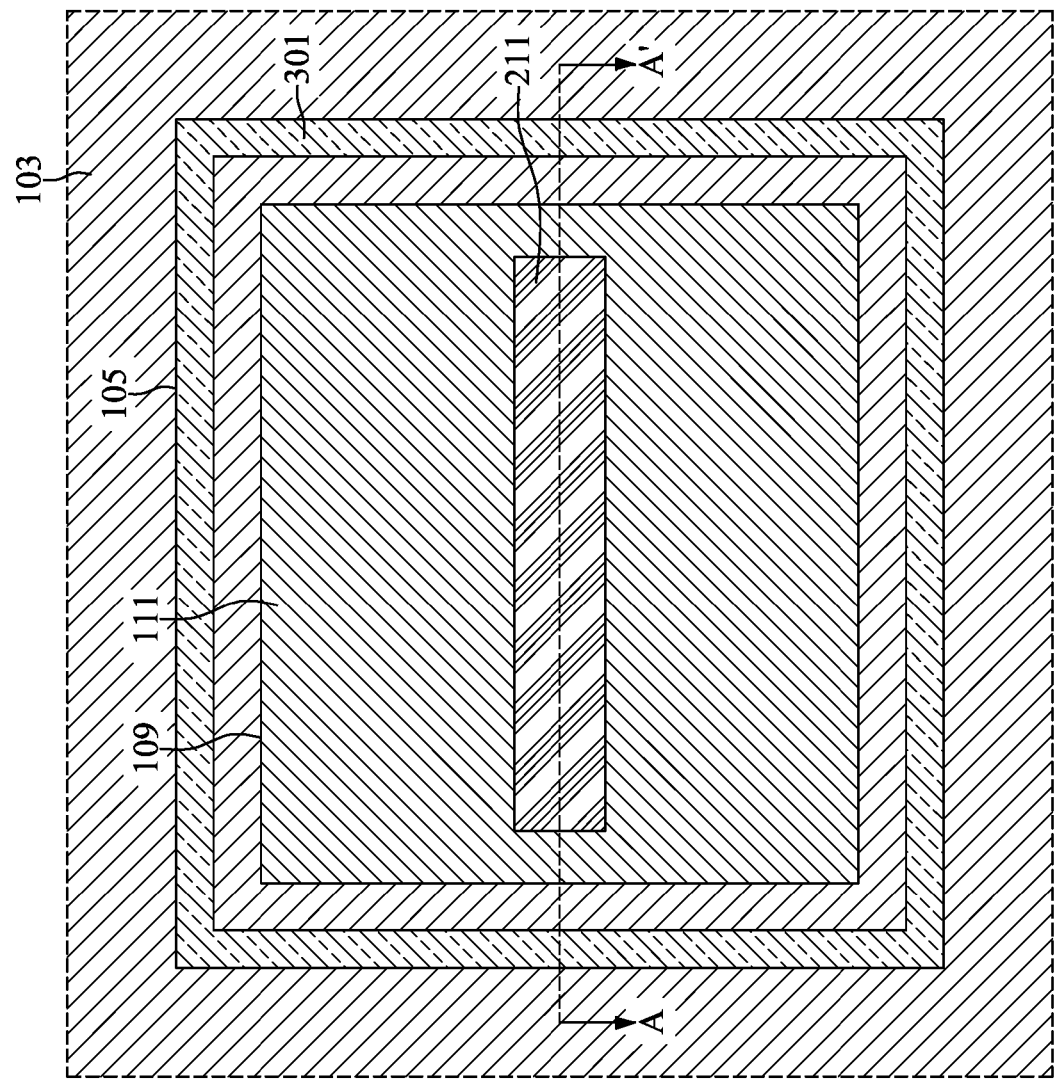
FIG. 8 illustrates, in a schematic top-view diagram, an intermediate semiconductor device in accordance with one embodiment of the present disclosure.
Figure 9:
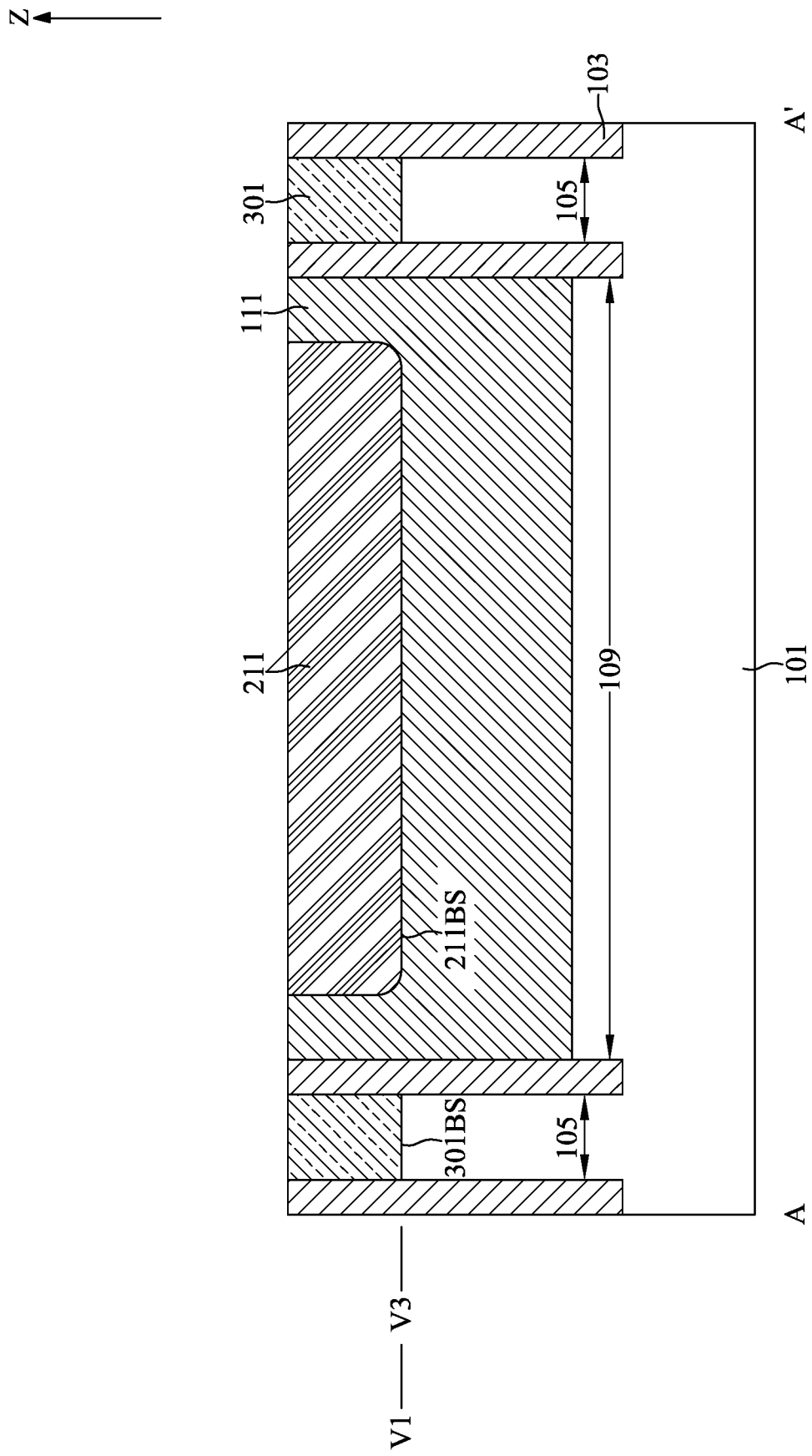
FIGS. 9 to 11 are schematic cross-sectional view diagrams taken along a line A-A' in FIG. 8 illustrating part of the flow for fabricating the semiconductor device in accordance with one embodiment of the present disclosure.
Figure 10:
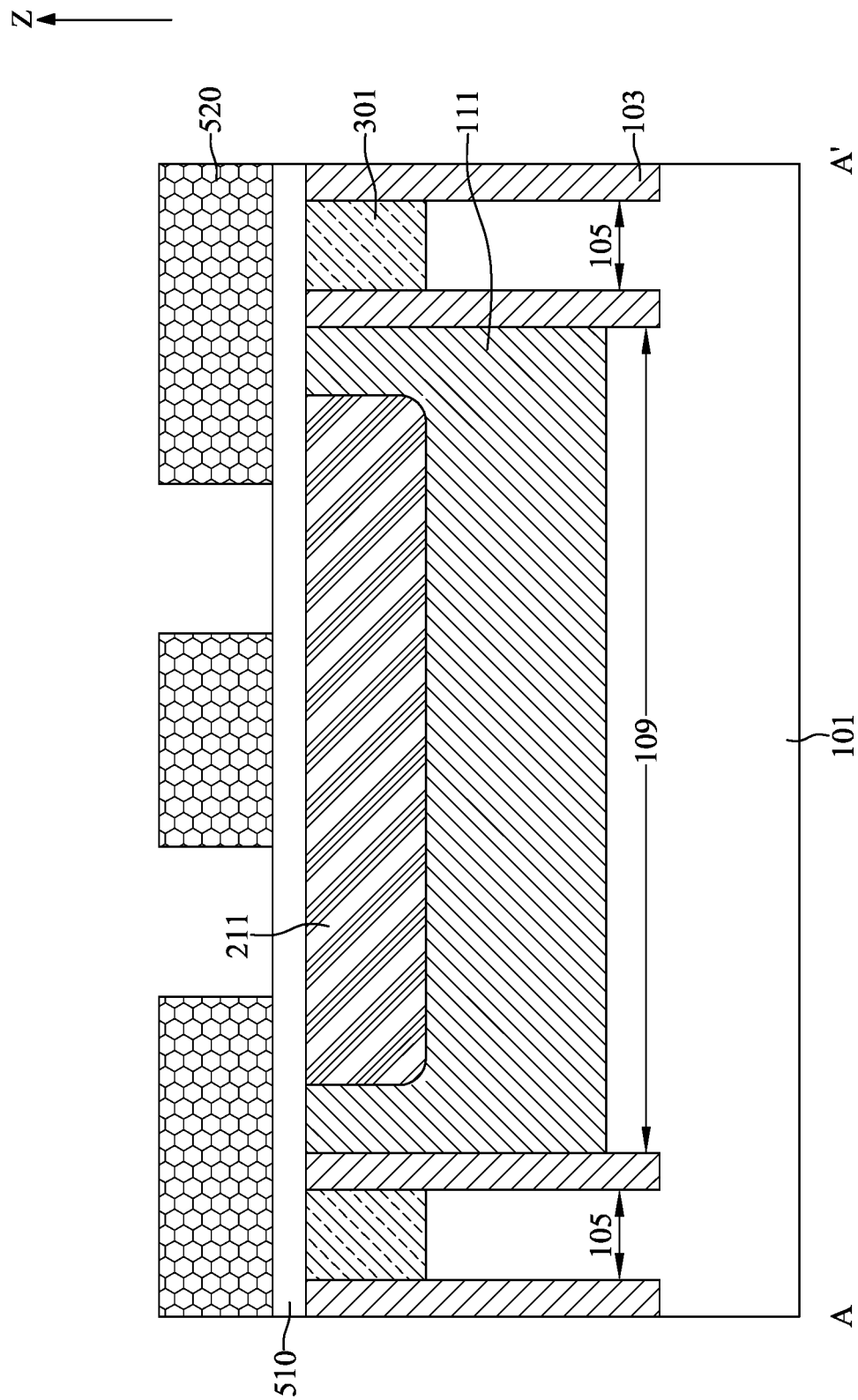
Figure 11:
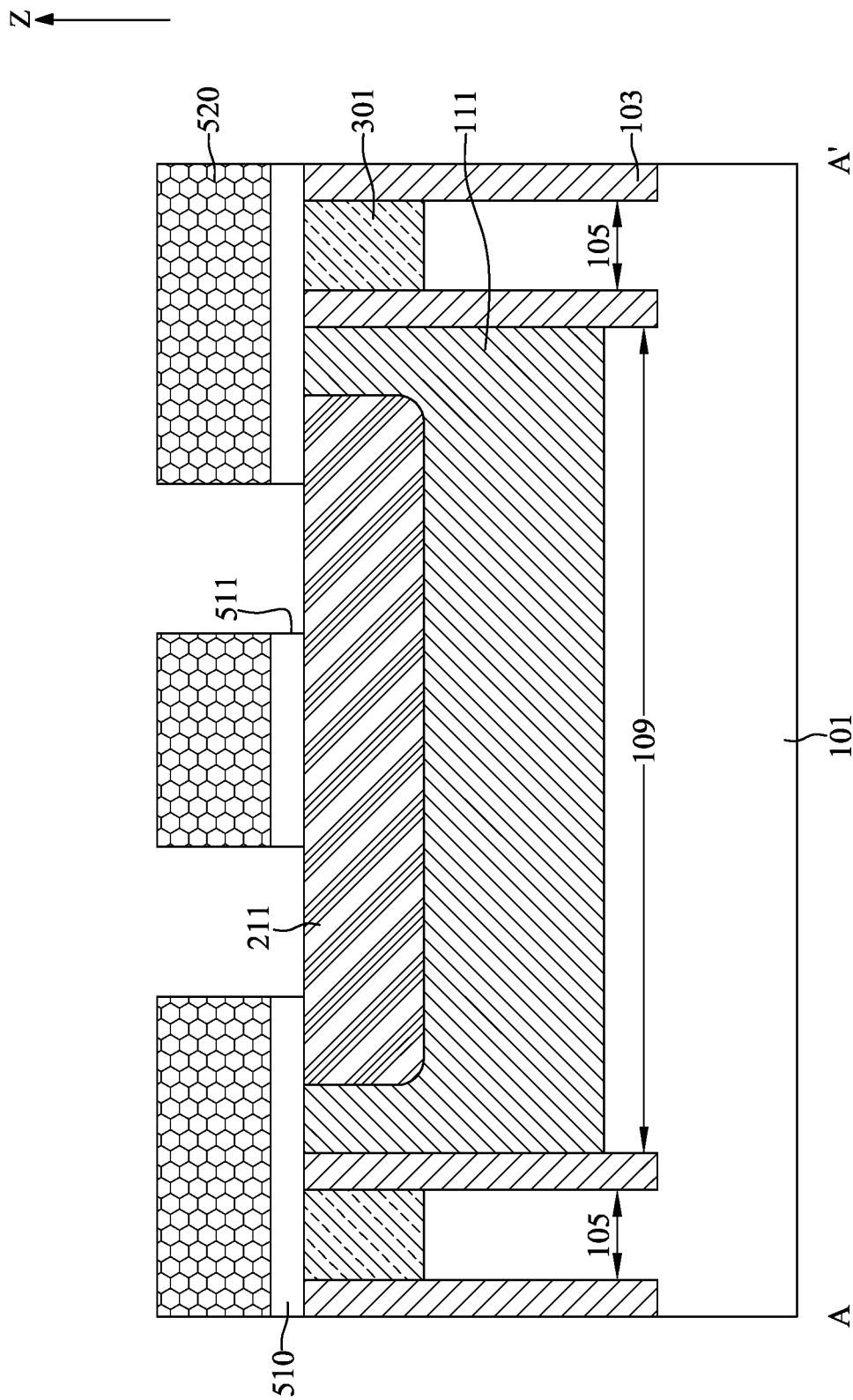

FIG. 6 illustrates, in a schematic top-view diagram, an intermediate semiconductor device in accordance with one embodiment of the present disclosure. FIG. 7 is a schematic cross-sectional view diagram taken along a line A-A' in FIG. 6. FIG. 8 illustrates, in a schematic top-view diagram, an intermediate semiconductor device in accordance with one embodiment of the present disclosure. FIGS. 9 to 11 are schematic cross-sectional view diagrams taken along a line A-A' in FIG. 8 illustrating part of the flow for fabricating the semiconductor device 1A in accordance with one embodiment of the present disclosure.

With reference to FIG. 1 and FIGS. 6 to 9, at step S13, a common layer 211 may be formed in the well region 111 and a first guard ring 301 may be formed in the first surrounding area 105.

With reference to FIGS. 6 and 7, a mask layer (not shown) including the pattern of the common layer 211 may be formed on the substrate 101 to expose a portion of the well region 111. An implantation process may be performed to dope the exposed portion of the well region 111 with n-type dopants. After the implantation process, the common layer 211 may be formed in the well region 111. The common layer 211 may have a second electrical type opposite to the first electrical type (i.e., n-type). In some embodiments, the dopant concentration of the common layer 211 may be greater than the dopant concentration of the well region 111.

With reference to FIGS. 6 and 7, the bottom surface 211BS of the common layer 211 may be at a vertical level V1 higher than a vertical level V2 of the bottom surface 111BS of the well region 111.

In some embodiments, an anneal process may be performed to activate the common layer 211. The temperature of the anneal process may be between about 800° C. and about 1250° C. The anneal process may have a process duration between about 1 millisecond and about 500 milliseconds. The anneal process may be, for example, a rapid thermal anneal, a laser spike anneal, or a flash lamp anneal.

With reference to FIGS. 8 and 9, a mask layer (not shown) may be formed on the substrate 101 to expose the first surrounding area 105. An implantation process may be performed to dope the exposed first surrounding area 105 with p-type dopants. After the implantation process, the first guard ring 301 may be formed in the first surrounding area 105. The first guard ring 301 may have the first electrical type (i.e., p-type). In some embodiments, the dopant concentration of the first guard ring 301 may be greater than the dopant concentration of the well region 111. In some embodiments, the dopant concentration of the first guard ring 301 and the dopant concentration of the common layer 211 may be substantially the same. In some embodiments, the dopant concentration of the first guard ring 301 and the dopant concentration of the common layer 211 may be different. For example, the dopant concentration of the first guard ring 301 may be greater than or less than the dopant concentration of the common layer 211. In some embodiments, the first guard ring 301 may include the same width as the first surrounding area 105.

With reference to FIGS. 8 and 9, the vertical level V3 of the bottom surface 301BS of the first guard ring 301 and the vertical level V1 of the bottom surface 211BS of the common layer 211 may be substantially the same. In some embodiments, the vertical level V3 of the bottom surface 301BS of the first guard ring 301 and the vertical level V1 of the bottom surface 211BS of the common layer 211 may be different. For example, the vertical level V3 of the bottom surface 301BS of the first guard ring 301 may be greater than or less than the vertical level V1 of the bottom surface 211BS of the common layer 211.

In some embodiments, an anneal process may be performed to activate the first guard ring 301. The temperature of the anneal process may be between about 800° C. and about 1250° C. The anneal process may have a process duration between about 1 millisecond and about 500 milliseconds. The anneal process may be, for example, a rapid thermal anneal, a laser spike anneal, or a flash lamp anneal.

Figure 12:
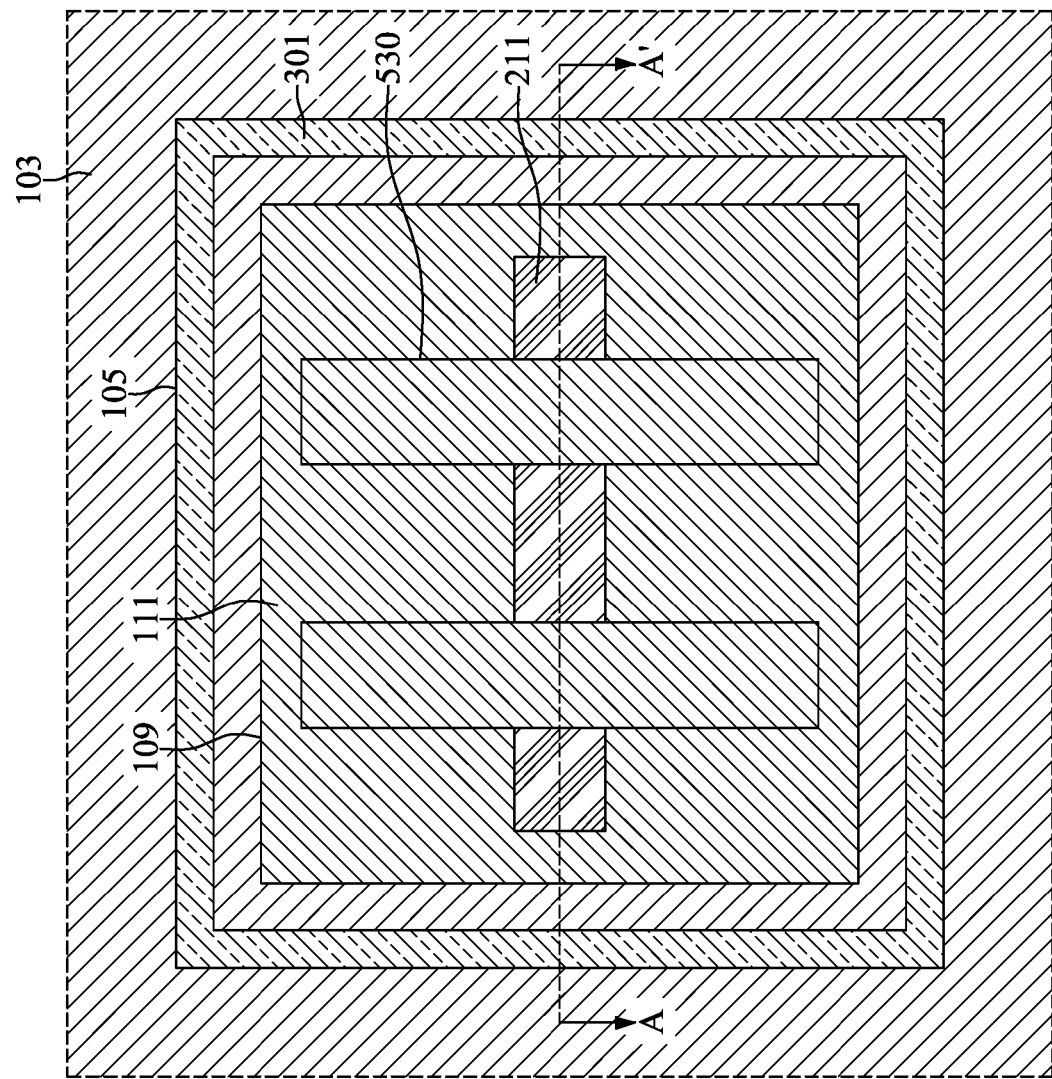
FIG. 12 illustrates, in a schematic top-view diagram, an intermediate semiconductor device in accordance with one embodiment of the present disclosure.

FIG. 12 illustrates, in a schematic top-view diagram, an intermediate semiconductor device in accordance with one embodiment of the present disclosure. FIGS. 13 to 19 are schematic cross-sectional view diagrams taken along a line A-A' in FIG. 12 illustrating part of the flow for fabricating the semiconductor device 1A in accordance with one embodiment of the present disclosure. FIG. illustrates, in a schematic top-view diagram, an intermediate semiconductor device in accordance with one embodiment of the present disclosure. FIG. 21 is a schematic cross-sectional view diagram taken along a line A-A' in FIG. 20.

With reference to FIG. 1 and FIGS. 10 to 13, at step S15, a plurality of recesses 530 may be formed in the well region 111.

With reference to FIG. 10, a hard mask layer 510 may be formed on the substrate 101. In some embodiments, the hard mask layer 510 may be formed of, for example, silicon nitride, silicon oxynitride, or silicon nitride oxide.

Alternatively, in some embodiments, the hard mask layer 510 may be formed of, for example, a carbon film. The term "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon.

The carbon film may be deposited by a process including introducing a processing gas mixture, consisting of one or more hydrocarbon compounds, into a processing chamber. The hydrocarbon compound has a formula $C_xH_y$, where x has a range of between 2 and 4 and y has a range of between 2 and 10. The hydrocarbon compounds may be, for example, propylene ($C_3H_6$), propyne ($C_3H_4$), propane ($C_3H_8$), butane ($C_4H_{10}$), butylene ($C_4H_8$), butadiene ($C_4H_6$), or acetylene ($C_2H_2$), or a combination thereof.

In some embodiments, the carbon film may be deposited from the processing gas mixture by maintaining a substrate temperature between about 100° C. and about 700° C., or between about 350° C. and about 550° C. In some embodiments, the carbon film may be deposited from the processing gas mixture by maintaining a chamber pressure between about 1 Torr and about 20 Torr. In some embodiments, the carbon film may be deposited from the processing gas mixture by introducing the hydrocarbon gas, and any inert, or reactive gases respectively, at a flow rate between about 50 sccm and about 2000 sccm.

In some embodiments, the processing gas mixture may further include an inert gas, such as argon. However, other inert gases, such as nitrogen or other noble gases, such as helium may also be used. Inert gases may be used to control the density and deposition rate of the carbon film. Additionally, a variety of gases may be added to the processing gas mixture to modify properties of the carbon film. The gases may be reactive gases, such as hydrogen, ammonia, a mixture of hydrogen and nitrogen, or a combination thereof. The addition of hydrogen or ammonia may be used to control the hydrogen ratio of the carbon film to control layer properties, such as etch selectivity, chemical mechanical polishing resistance property, and reflectivity. In some embodiments, a mixture of reactive gases and inert gases may be added to the processing gas mixture to deposit the carbon film.

In some embodiments, the carbon film may include carbon and hydrogen atoms, which may be an adjustable carbon:hydrogen ratio that ranges from about 10% hydrogen to about 60% hydrogen. Controlling the hydrogen ratio of the carbon film may tune the respective etch resistance property and chemical mechanical polishing resistance property.

Alternatively, in some embodiments, the hard mask layer 510 may be formed of, for example, boron nitride, silicon boron nitride, phosphorus boron nitride, boron carbon silicon nitride, or the like. The hard mask layer 510 may be formed by a film formation process and a treatment process. Detailedly, in the film formation process, first precursors, which may be boron-based precursors, may be introduced over the substrate 101 to form a boron-based layer. Subsequently, in the treatment process, second precursors, which may be nitrogen-based precursors, may be introduced to react with the boron-based layer and turn the boron-based layer into the hard mask layer 510.

With reference to FIG. 10, a mask layer 520 may be formed on the hard mask layer 510. The mask layer 520 may include the pattern of the plurality of recesses 530. In some embodiments, the mask layer 520 may be a photoresist layer.

With reference to FIG. 11, a hard mask etch process may be performed to remove portions of the hard mask layer 510 and the pattern of the mask layer 520 may be transferred to the hard mask layer 510. The etch rate of the hard mask layer 510 of the hard mask etch process may be faster than the etch rate of the substrate 101 of the hard mask etch process. For example, an etch rate ratio of the hard mask layer 510 to the substrate 101 may be between about 100:1 and about 1.05:1 during the hard mask etch process. For another example, the etch rate ratio of the hard mask layer 510 to the substrate 101 may be between about 100:1 and about 10:1 during the hard mask etch process. After the hard mask etch process, a plurality of hard mask opening 511 may be formed along the hard mask layer 510. Portions of the common layer 211 may be exposed through the plurality of hard mask openings 511. After formation of the plurality of hard mask openings 511, the mask layer 520 may be removed.

Figure 13:
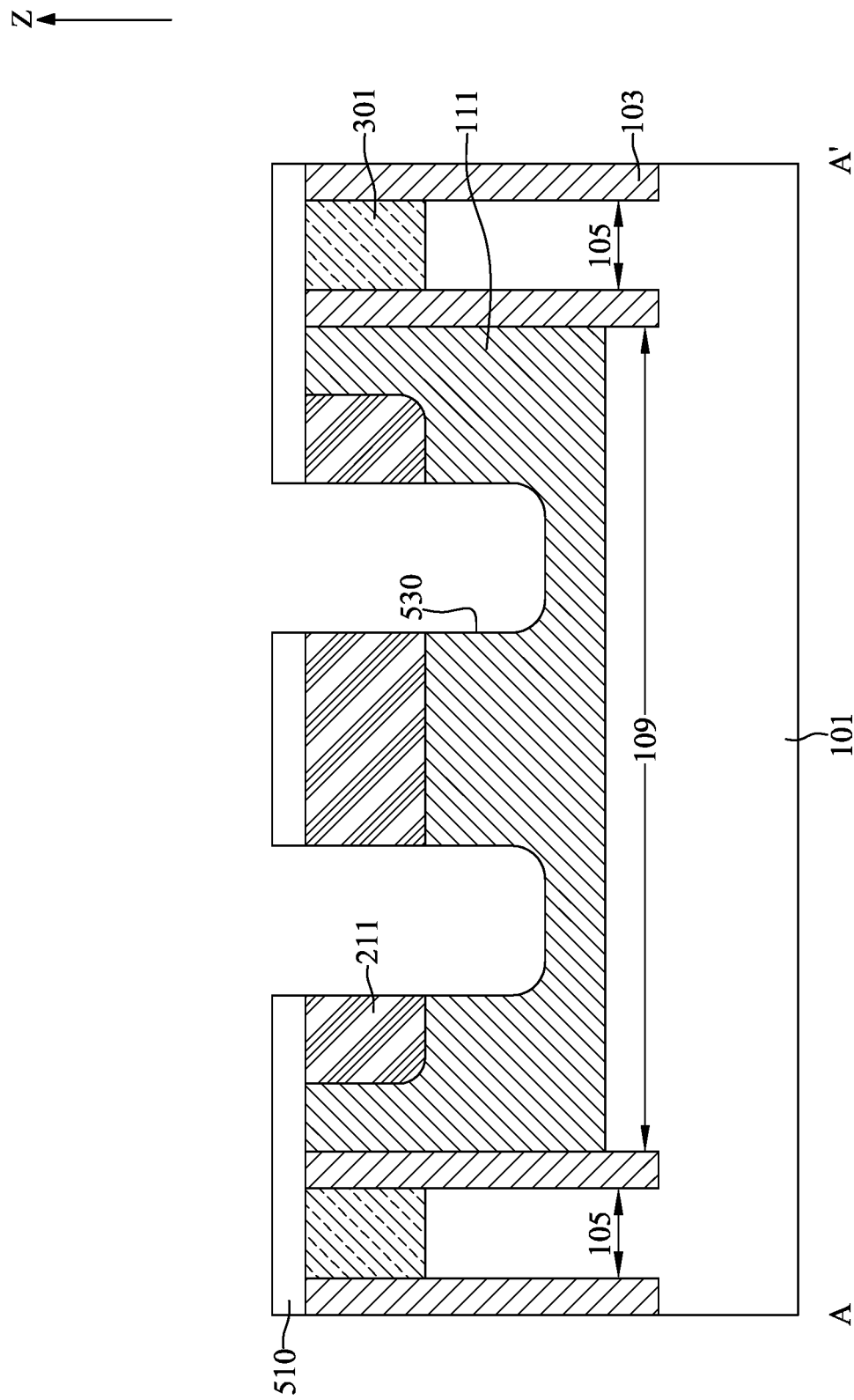
FIGS. 13 to 19 are schematic cross-sectional view diagrams taken along a line A-A' in FIG. 12 illustrating part of the flow for fabricating the semiconductor device in accordance with one embodiment of the present disclosure.

With reference to FIGS. 12 and 13, a recess etch process using the hard mask layer 510 as a mask may be performed to remove portions of the common layer 211 and portions of the well region 111 to form the plurality of recesses 530. In some embodiments, the etch rate ratio of the common layer 211 to the hard mask layer 510 may be between about 100:1 and about 1.05:1, between about 15:1 and about 2:1, or between about 10:1 and about 2:1 during the recess etch process. In some embodiments, the etch rate ratio of the well region 111 to the hard mask layer 510 may be between about 100:1 and about 1.05:1, between about 15:1 and about 2:1, or between about 10:1 and about 2:1 during the recess etch process. The plurality of recesses 530 may divide the common layer 211 into multiple segments.

Figure 14:
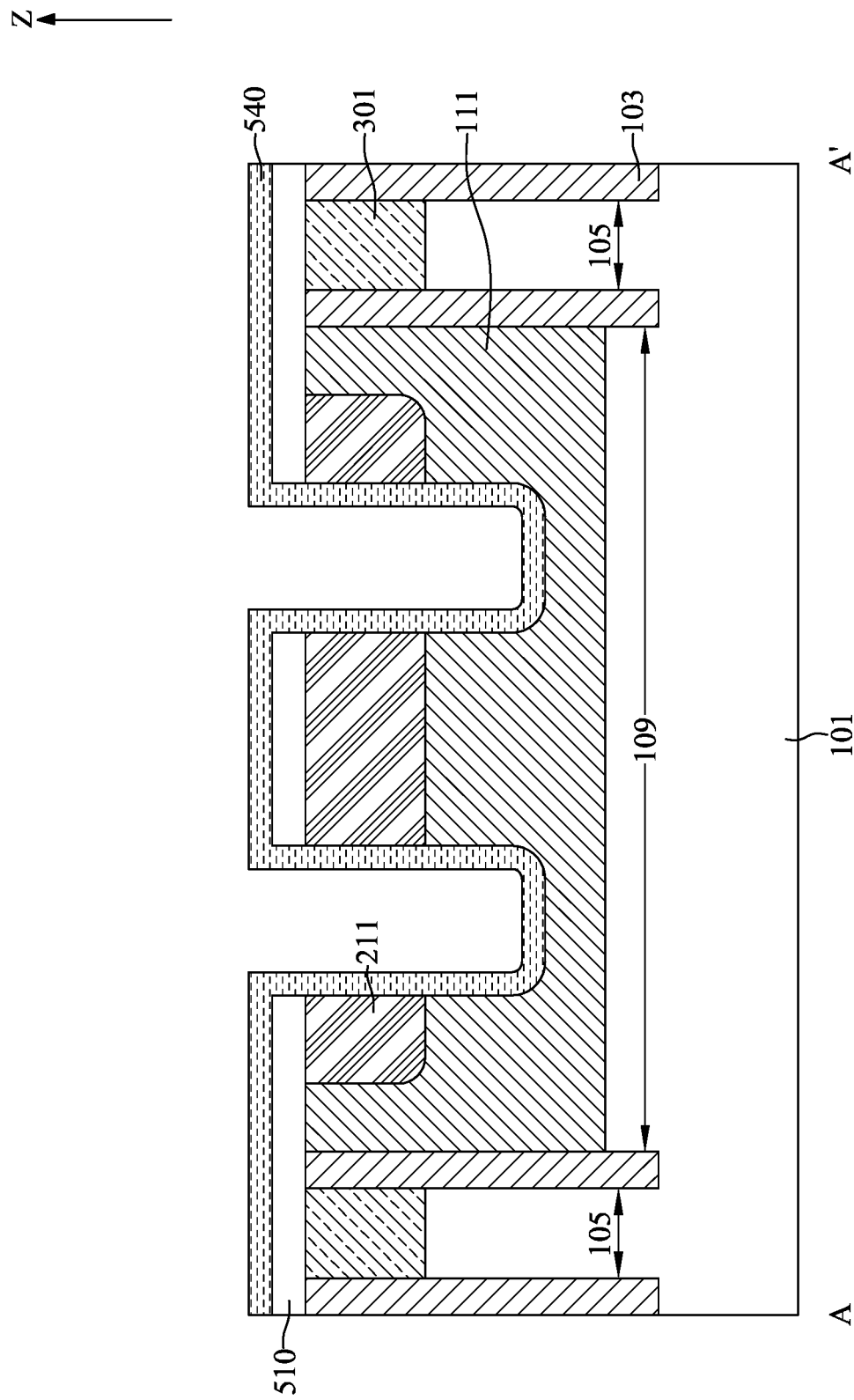
Figure 15:
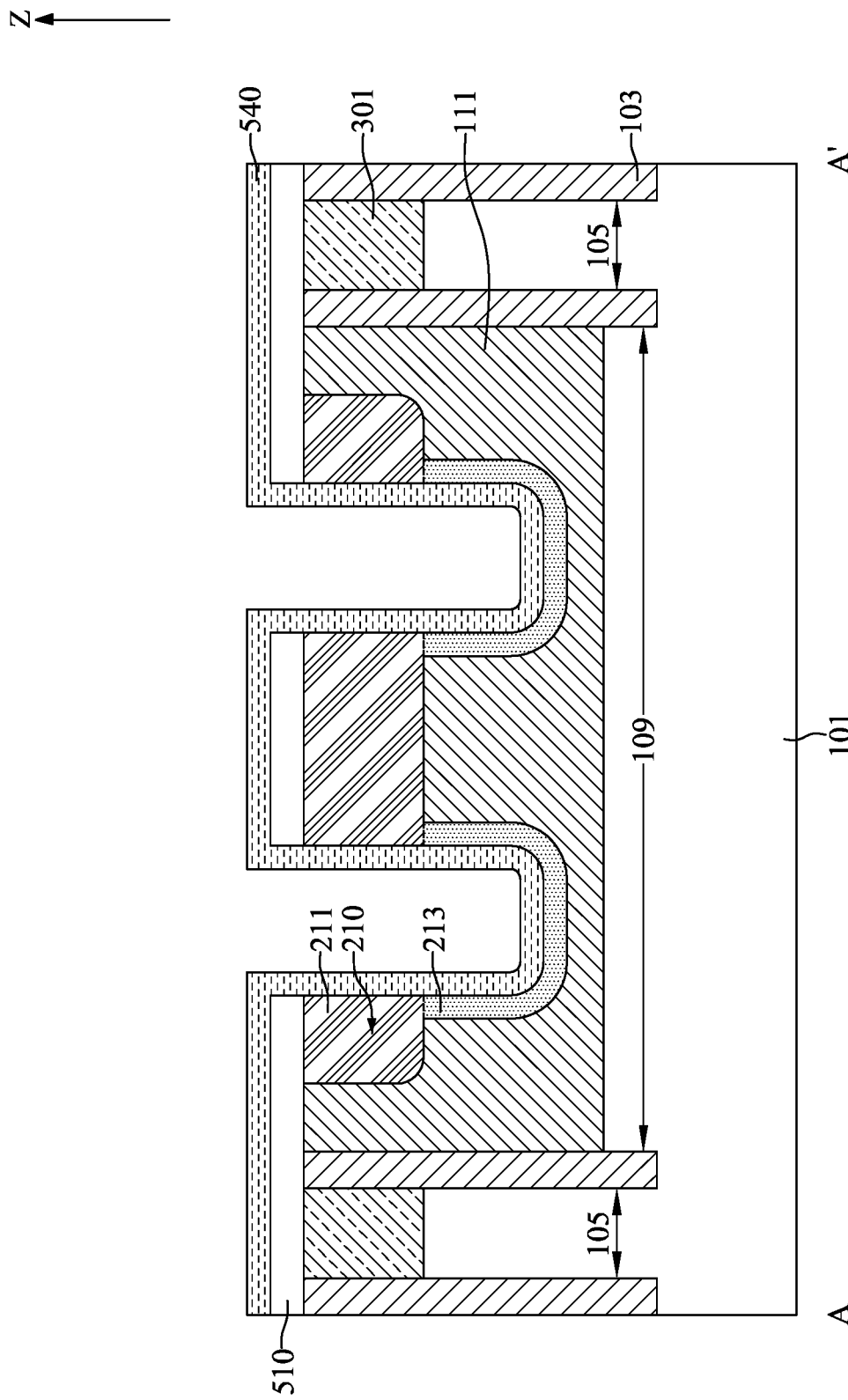

With reference to FIGS. 1, 14, and 15, at step S17, a plurality of connection layers 213 may be formed in the well region 111 and the plurality of connection layers 213 and the common layer 211 configure a first electrode 210.

With reference to FIG. 14, a doping layer 540 may be conformally formed on the hard mask layer 510 and on the inner surfaces of the plurality of recesses 530. The doping layer 540 may be formed of, for example, arsenic silicate glass and may serve as a dopant source for forming the plurality of connection layers 213.

With reference to FIG. 15, the plurality of connection layers 213 may be formed along the plurality of recesses 530, adjacent to the doping layer 540, and connecting to the first electrode 210. The plurality of connection layers 213 may reconnect the multiple segments of the common layer 211 previously separated by the plurality of recesses 530. The plurality of connection layers 213 may be formed by, for example, solid phase diffusion of the doping layer 540 or other applicable process. After formation of the plurality of connection layers 213, the doping layer 540 may be removed.

In some embodiments, the plurality of connection layers 213 may have the same electrical type as the common layer 211 (i.e., the first electrical type). In some embodiments, the dopant concentration of the plurality of connection layers 213 and the dopant concentration of the common layer 211 may be substantially the same. In some embodiments, the dopant concentration of the plurality of connection layers 213 and the dopant concentration of the common layer 211 may be different. For example, the dopant concentration of the plurality of connection layers 213 may be less than or greater than the dopant concentration of the common layer 211.

In some embodiments, the electrical type of the first electrode 210 and the electrical type of the well region 111 may be opposite to each other which may provide additional electrical isolation to the first electrode 210 by configuring a P-N junction at the interface between the first electrode 210 and the well region 111.

With reference to FIG. 1 and FIGS. 16 to 21, at step S19, a plurality of middle insulating layers 220 may be formed in the plurality of recesses 530, a plurality of second electrode layers 230 may be formed on the plurality of middle insulating layers 220, a plurality of capping layers 240 may be formed on the plurality of second electrode layers 230, and the first electrode 210, the plurality of middle insulating layers 220, and the plurality of second electrode layers 230 configure a plurality of programmable units 200.

Figure 16:
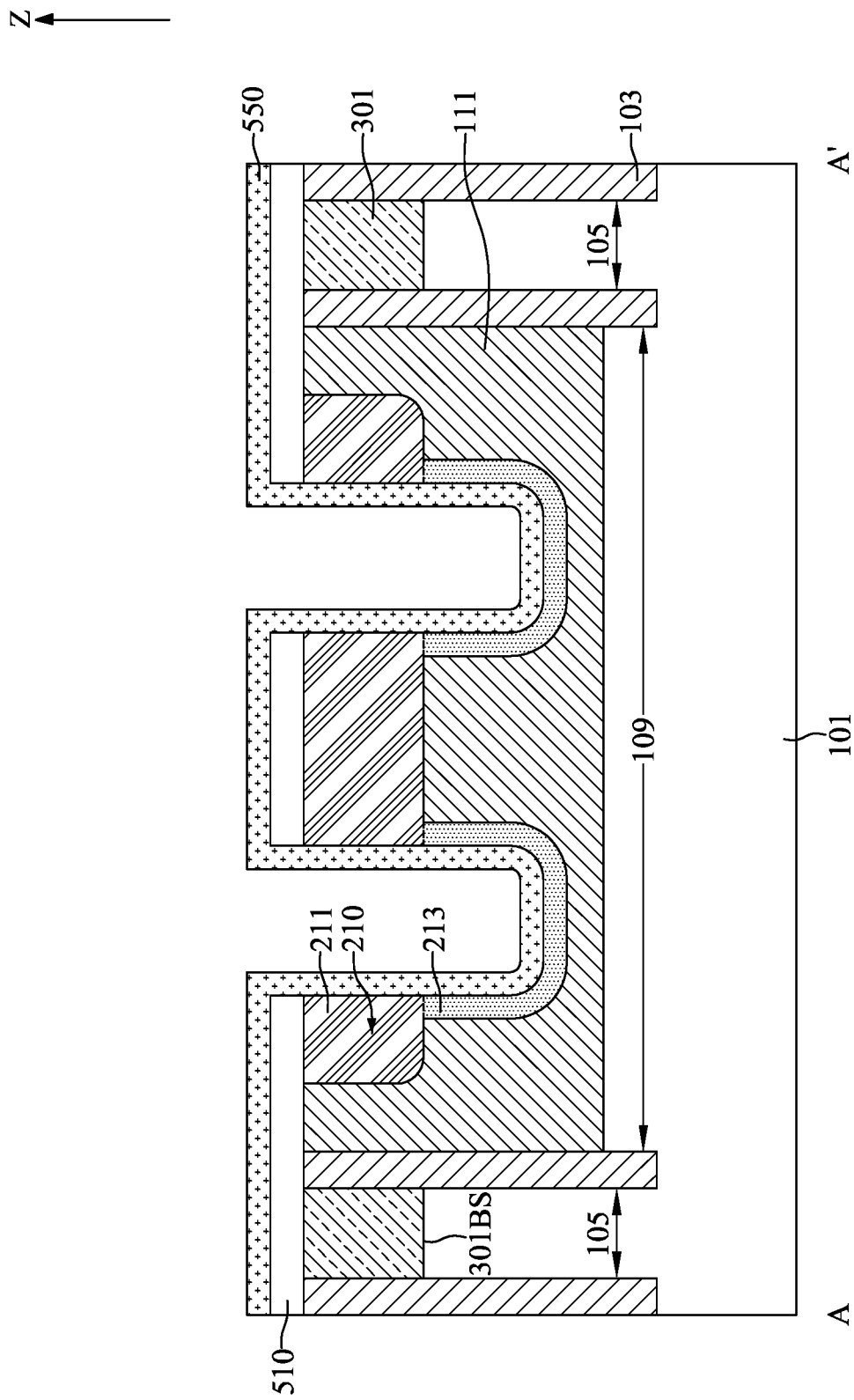

With reference to FIG. 16, a layer of first insulating material 550 may be conformally formed on the top surface of the hard mask layer 510 and the inner surfaces of the plurality of recesses 530. The first insulating material 550 may include, for example, oxides, nitrides, oxynitrides, silicates (e.g., metal silicates), aluminates, titanates, nitrides, high-k dielectric materials, or a combination thereof. In some embodiments, the first insulating material 550 may be formed by suitable deposition processes, for example, chemical vapor deposition, plasma-enhanced chemical vapor deposition, atomic layer deposition, evaporation, chemical solution deposition, or other suitable deposition processes. The thickness of the insulation layer 105 may vary depending on the deposition process as well as the composition and number of materials used. For example, the thickness of the layer of first insulating material 550 may be between about 10 angstroms and about 50 angstroms.

Examples of high-k dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric materials may further include dopants such as, for example, lanthanum and aluminum.

In some embodiments, the layer of first insulating material 550 may include multiple layers. For example, the layer of first insulating material 550 may include an oxide-nitride-oxide (ONO) structure. For another example, the layer of first insulating material 550 may include a bottom layer formed of silicon oxide and a top layer formed of high-k dielectric materials.

In some embodiments, an interfacial layer (not shown) may be conformally formed between the inner surfaces of the plurality of recesses 530 and the layer of first insulating material 550. The interfacial layer may be formed of, for example, silicon oxide, silicon nitride, silicon oxynitride, other semiconductor oxides, or a combination thereof. The interfacial layer may be formed to any suitable thickness using any suitable process including thermal growth, atomic layer deposition, chemical vapor deposition, high-density plasma chemical vapor deposition, spin-on deposition, or other suitable deposition processes. For example, the thickness of the interfacial layer may be between about 7 angstroms and 12 angstroms or between about 8 angstroms and 10 angstroms. The interfacial layer may facilitate the formation of the layer of first insulating material 550.

Figure 17:
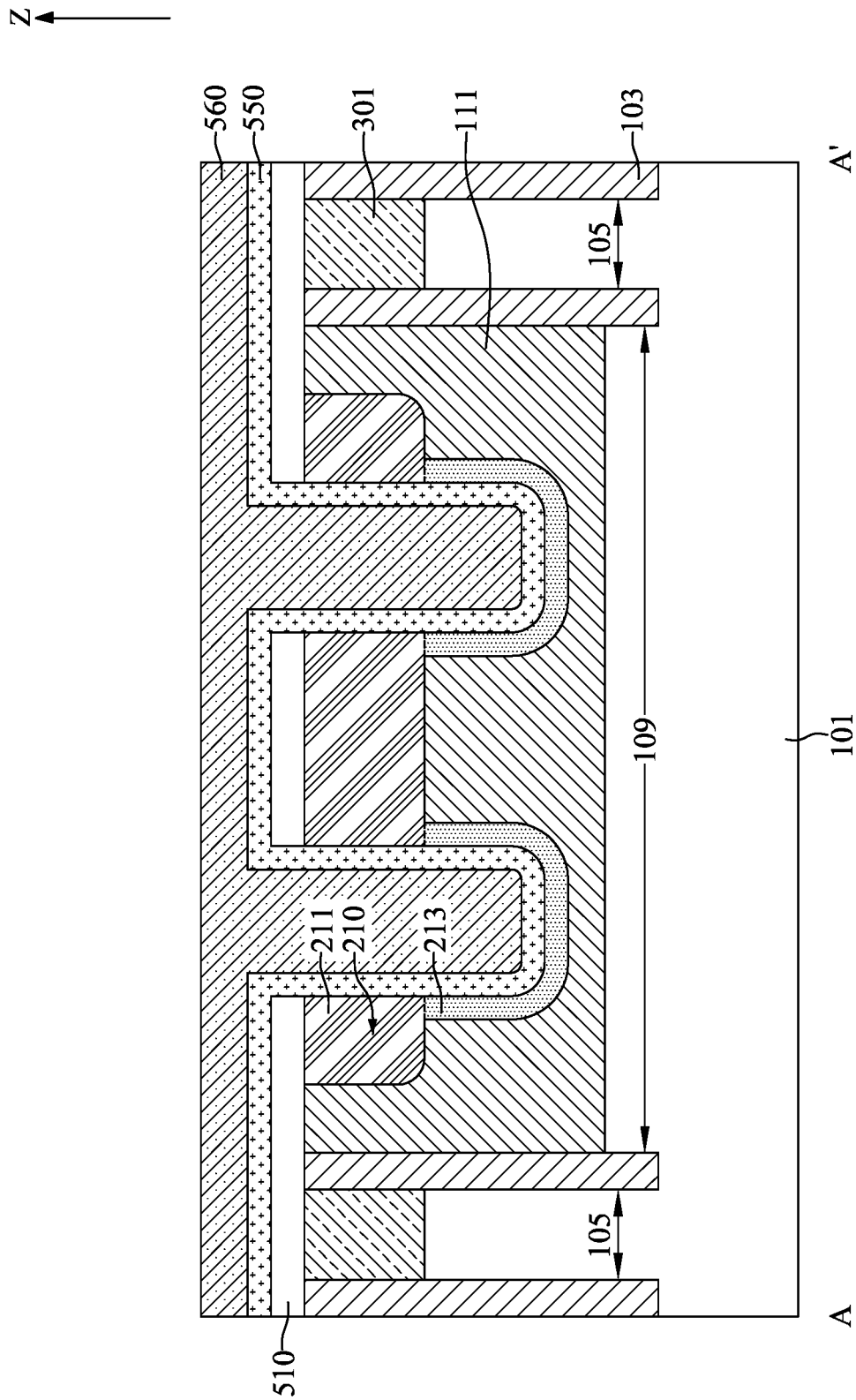

With reference to FIG. 17, a layer of conductive material 560 may be formed on the layer of first insulating material 550 and completely filling the plurality of recesses 530. In some embodiments, the conductive material 560 may be, for example, polycrystalline silicon, polycrystalline silicon germanium, or a combination thereof. In some embodiments, the layer of conductive material 560 may be doped with dopants such as phosphorus, arsenic, antimony, or boron. In some embodiments, the layer of conductive material 560 may include the same electrical type as the electrical type of the first electrode 210. In some embodiments, the electrical type of the layer of conductive material 560 and the electrical type of the first electrode 210 may be opposite to each other. In some embodiments, the conductive material 560 may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof.

In some embodiments, the layer of conductive material 560 may include multiple layers such as a bottom layer (not shown) and a top layer (not shown) formed on the bottom layer. The bottom layer may be formed of, for example, doped polycrystalline silicon, doped polycrystalline silicon germanium, or a combination thereof. The top layer may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof.

Figure 18:
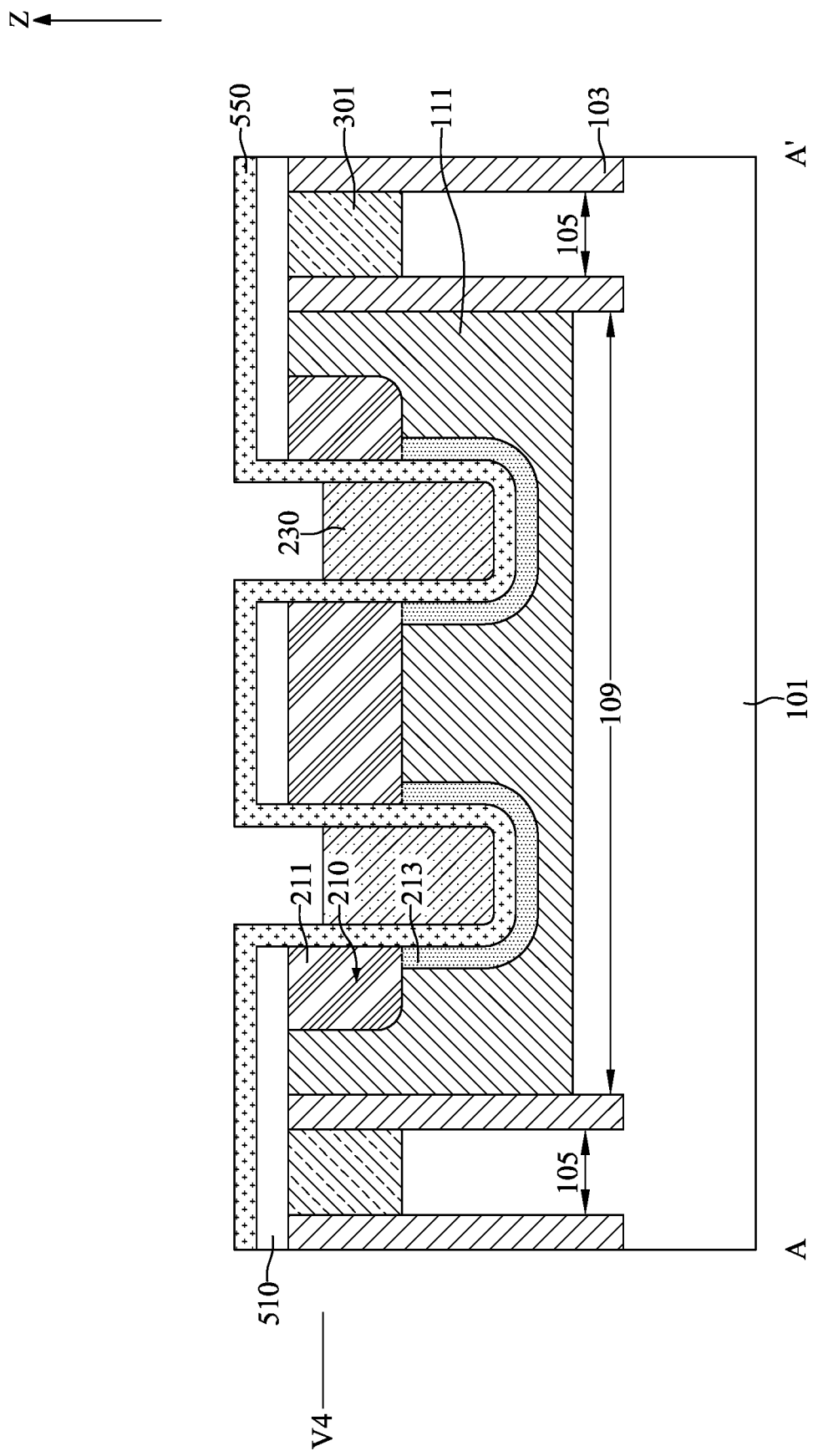

With reference to FIG. 18, a recess process may be performed to remove portions of the conductive material 560. After the recess process, the layer of conductive material 560 may be turned into the plurality of second electrode layers 230 in the plurality of recesses 530, respectively and correspondingly. The top surface 230TS of the second electrode layer 230 may be at a vertical level V4 lower than the top surface of the substrate 101.

In some embodiments, the etch rate ratio of the conductive material 560 to the first insulating material 550 may be between about 100:1 and about 1.05:1, between about 15:1 and about 2:1, or between about 10:1 and about 2:1 during the recess etch process. In some embodiments, the recess process may be an isotropic etching process such as wet etching. In some embodiments, the recess process may be an anisotropic etching process such as anisotropic dry etching process.

Figure 19:
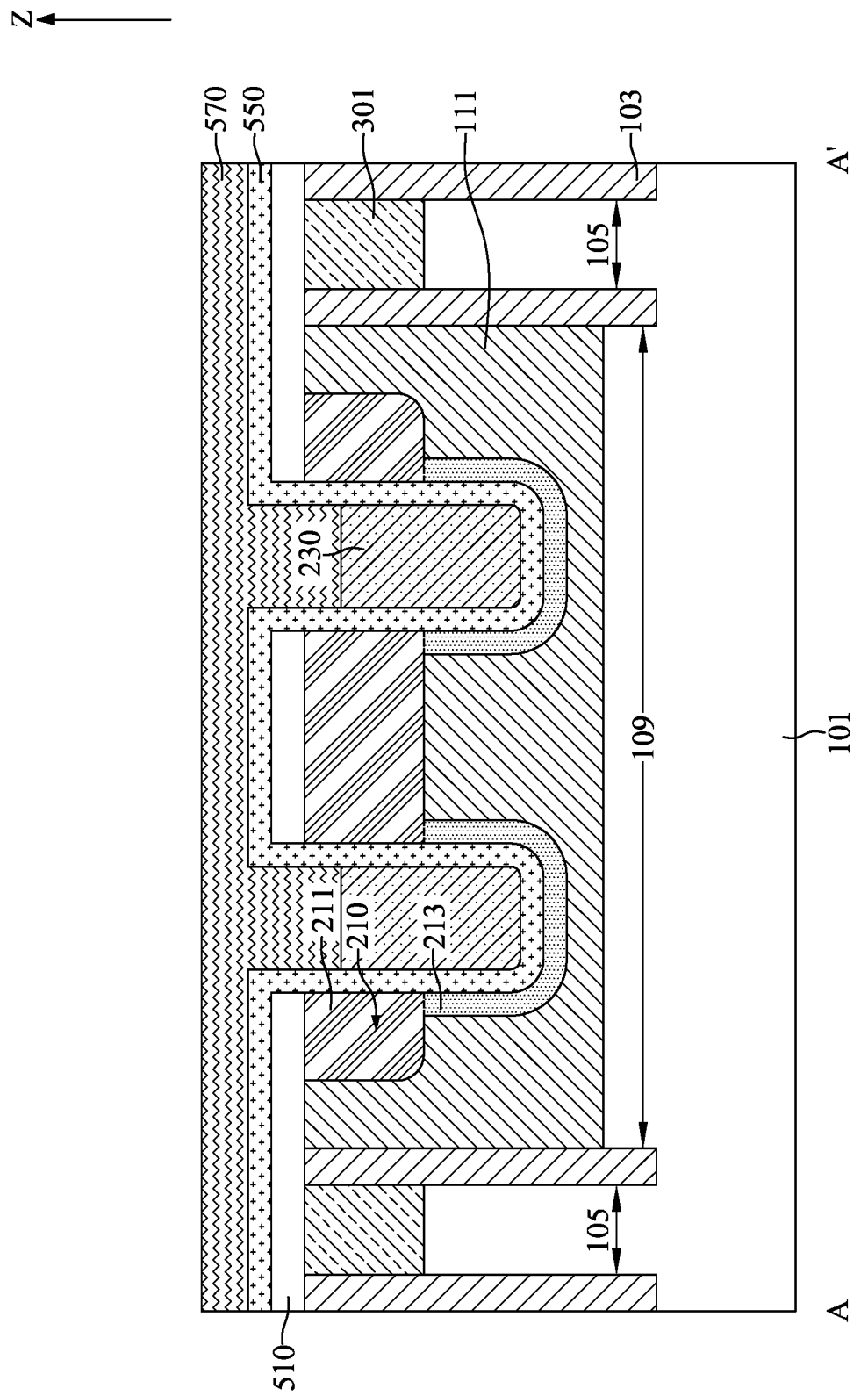

With reference to FIG. 19, a layer of second insulating material 570 may be formed on the plurality of second electrode layers 230 and the layer of first insulating material 550. The layer of second insulating material 570 may completely fill the plurality of recesses 530. In some embodiments, the second insulating material 570 may be, for example, oxides, nitrides, oxynitrides, silicates (e.g., metal silicates), aluminates, titanates, nitrides, high-k dielectric materials, or a combination thereof. In some embodiments, the second insulating material 570 may be formed by suitable deposition processes, for example, chemical vapor deposition, plasma-enhanced chemical vapor deposition, atomic layer deposition, evaporation, chemical solution deposition, or other suitable deposition processes.

Figure 20:
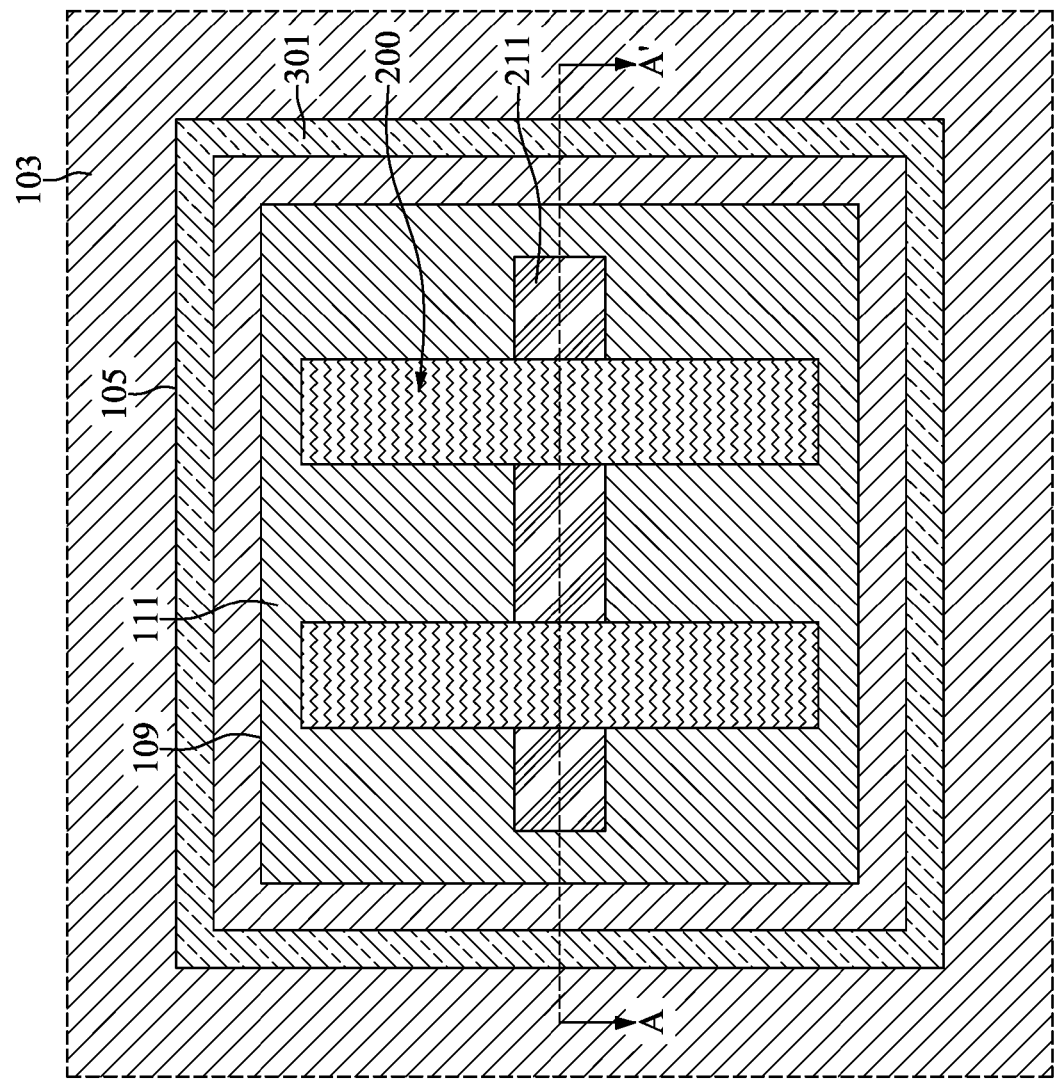
FIG. 20 illustrates, in a schematic top-view diagram, an intermediate semiconductor device in accordance with one embodiment of the present disclosure.
Figure 21:
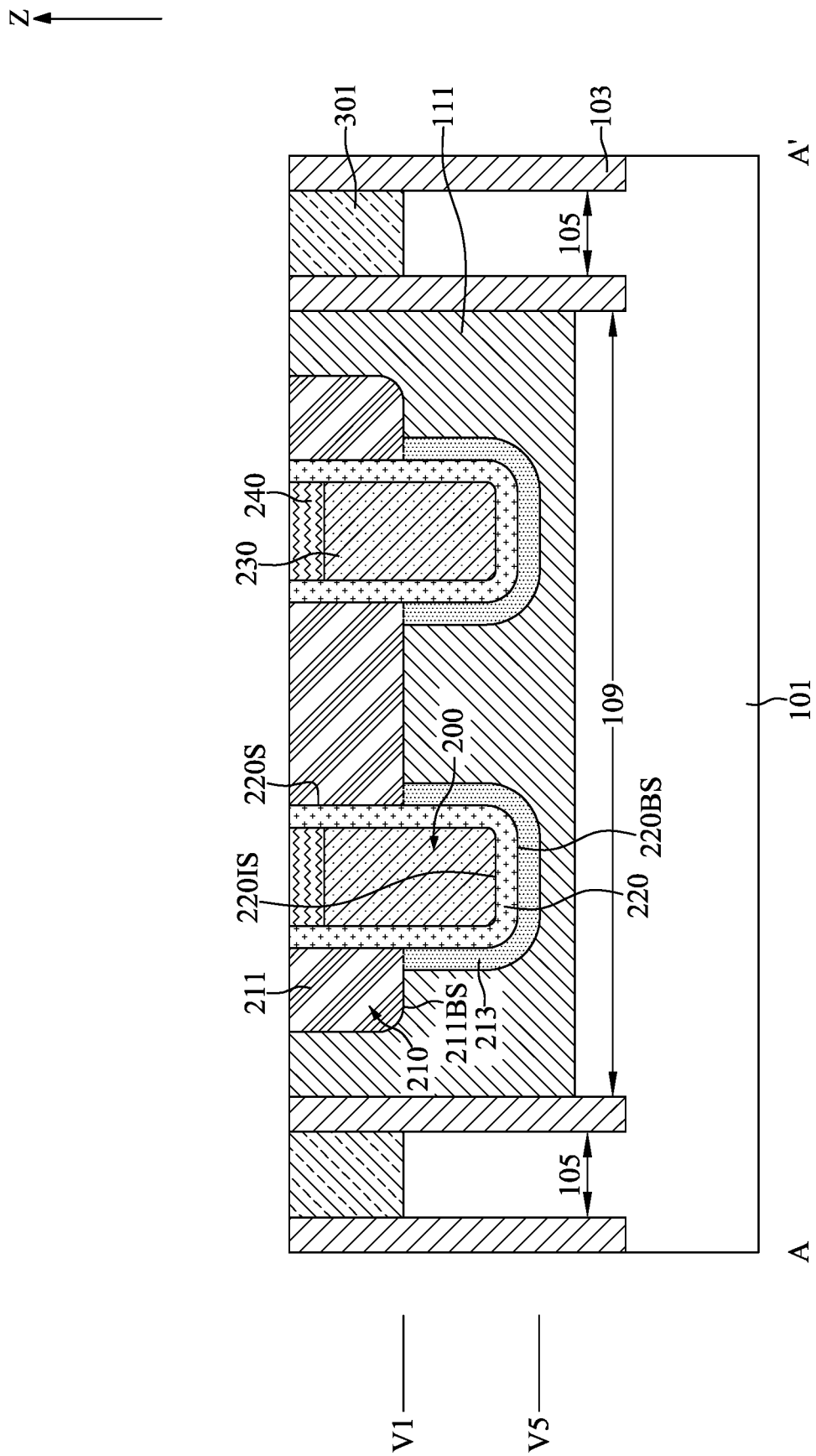
FIG. 21 is a schematic cross-sectional view diagram taken along a line A-A' in FIG. 20.

With reference to FIGS. 20 and 21, a planarization process, such as chemical mechanical polishing, may be performed until the top surface of the substrate 101 is exposed to remove excess material and provide a substantially flat surface for subsequent processing steps. After the planarization process, the remaining first insulating material 550 in the plurality of recesses 530 may be referred to as the plurality of middle insulating layers 220. The remaining second insulating material 570 in the plurality of recesses 530 may be referred to as the plurality of capping layers 240. The first electrode 210, the plurality of middle insulating layers 220, and the plurality of second electrode layers 230 configure the plurality of programmable units 200 in the well region 111. In some embodiments, the plurality of capping layers 240 may be also referred to as part of the plurality of programmable units 200.

For brevity, clarity, and convenience of description, only one middle insulating layer 220, one second electrode layer 230, one capping layer 240, and one connection layer 213 are described.

The middle insulating layer 220 may include a U-shaped cross-sectional profile. The common layer 211 of the first electrode 210 may be disposed on two sides 220S of the middle insulating layer. The bottom surface 211BS of the common layer 211 may be at the vertical level V1 greater than a vertical level V5 of the bottom surface 220BS of the middle insulating layer 220. The connection layer 213 may include a U-shaped cross-sectional profile. The connection layer 213 may be disposed on the two sides 220S and the bottom surface 220BS of the middle insulating layer 220. The connection layer 213 may connect the common layer 211 separately disposed on the two sides 220S of the middle insulating layer 220. The second electrode layer 230 may be disposed on the inner surface 2201S of the middle insulating layer 220.

Figure 22:
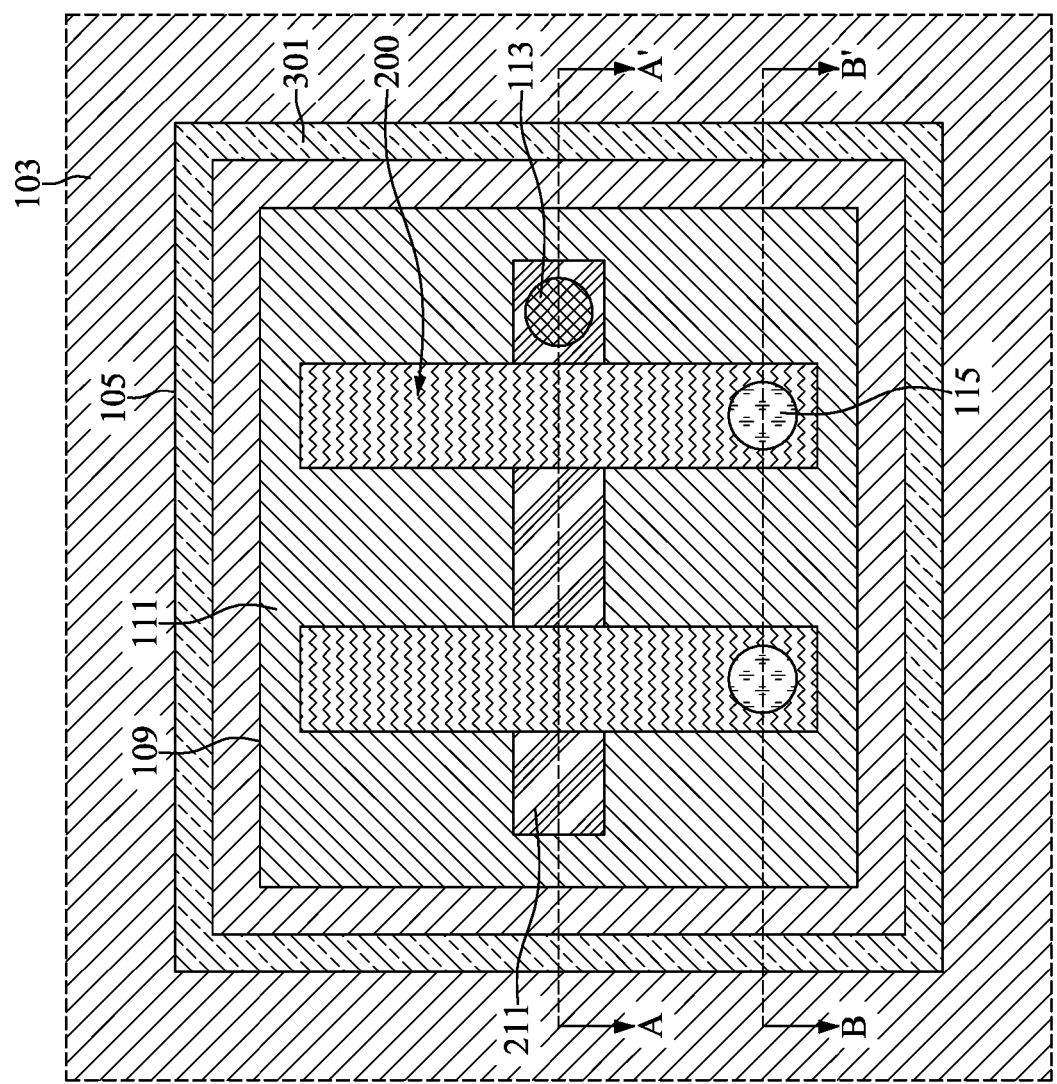
FIG. 22 illustrates, in a schematic top-view diagram, an intermediate semiconductor device in accordance with one embodiment of the present disclosure.
Figure 23:
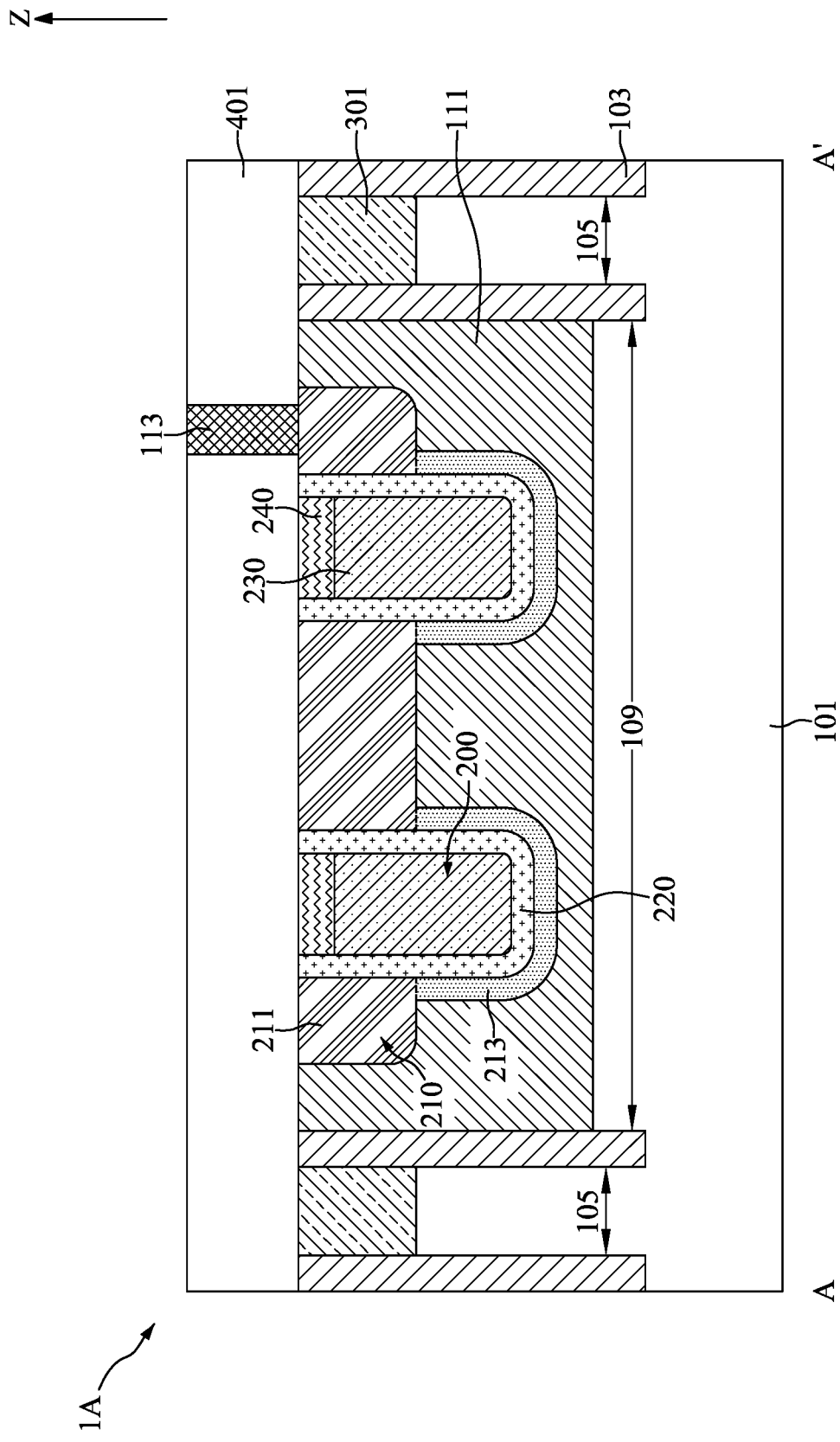
FIGS. 23 and 24 are schematic cross-sectional view diagrams taken along lines A-A' and B-B' in FIG. 22.
Figure 24:
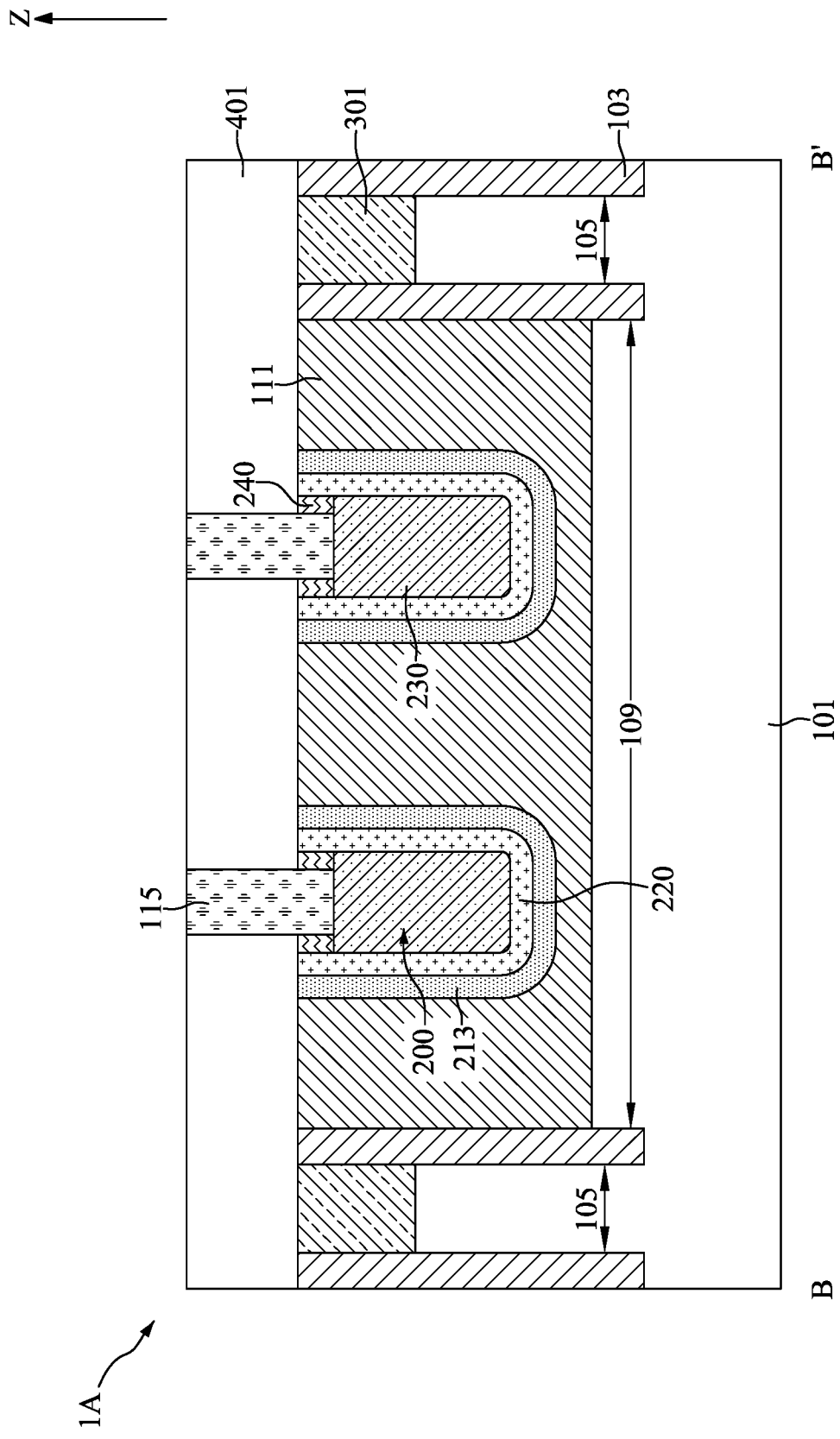

FIG. 22 illustrates, in a schematic top-view diagram, an intermediate semiconductor device in accordance with one embodiment of the present disclosure. FIGS. 23 and 24 are schematic cross-sectional view diagrams taken along lines A-A' and B-B' in FIG. 22. Some elements may be omitted in the top-view diagram for clarity.

With reference to FIG. 1 and FIGS. 22 to 24, at step S21, a common contact 113 may be formed on the common layer 211 and a plurality of first contacts 115 may be formed on the plurality of second electrode layers 230.

With reference to FIGS. 22 to 24, a first dielectric layer 401 may be formed on the substrate 101 and may be formed of, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the first dielectric layer 401 may include a self-planarizing material such as a spin-on glass or a spin-on low-k dielectric material such as SiLK™. The use of a self-planarizing dielectric material may avoid the need to perform a subsequent planarizing step. In some embodiments, the first dielectric layer 401 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps.

With reference to FIGS. 22 to 24, the common contact 113 may be formed along the first dielectric layer 401 and on the common layer 211. In some embodiments, the common contact 113 may be grounded to provide a baseline voltage to the plurality of programmable units 200. In some embodiments, the common contact 113 may be configured to electrically couple to an external voltage source. The external voltage source may be grounded or may be set to between about 0.0 volts and about −2.0 volts. In some embodiments, the common contact 113 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

For brevity, clarity, and convenience of description, only one first contact 115 is described.

With reference to FIGS. 22 to 24, the first contact 115 may be formed along the first dielectric layer 401 and the capping layer 240 and on the second electrode layer 230. The first contact 115 may be electrically coupled to an external voltage which can provide a programming voltage during a programming procedure. The programming voltage may be between about +4.0 volts and about +6.0 volts. In some embodiments, the first contact 115 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

In an exemplary programming procedure of the present embodiment, a programming voltage may be applied to the semiconductor device 1A through one of the selected first contact 115 and the common contact 113 may be electrically coupled to ground potential. The middle insulating layer 220 corresponding to the selected first contact 115 may be stressed under the programming voltage. As a result, the middle insulating layer 220 may be ruptured to form a contiguous path(s) connecting the first electrode 210 and the second electrode layer 230. That is, the programmable unit 200 corresponding to the selected first contact 115 is blown out.

Figure 25:
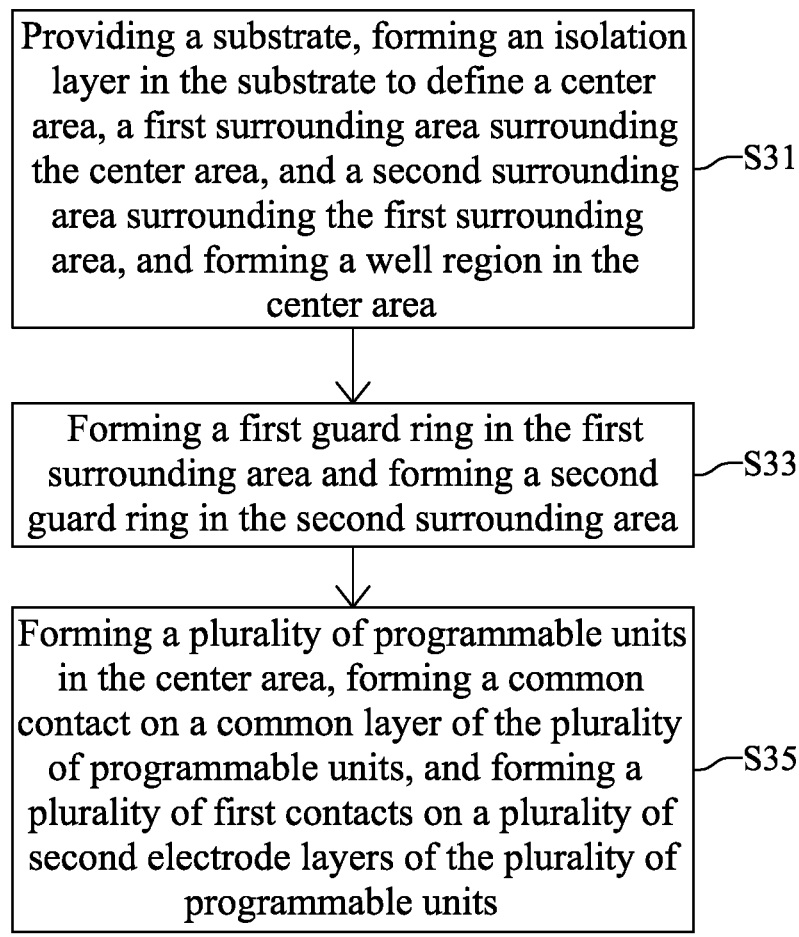
FIG. 25 illustrates, in a flowchart diagram form, a method fabricating a semiconductor device in accordance with another embodiment of the present disclosure.
Figure 26:
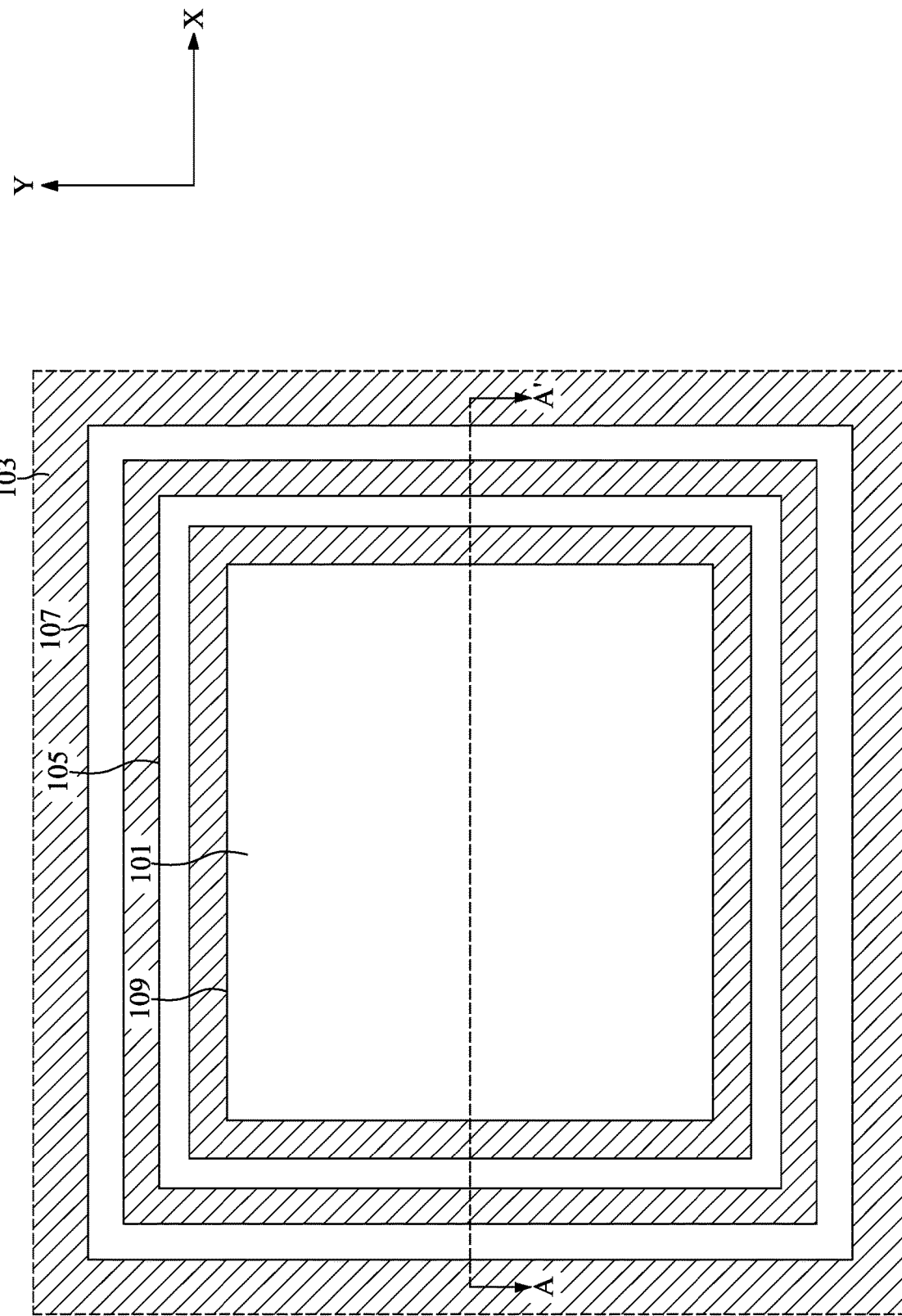
FIG. 26 illustrates, in a schematic top-view diagram, an intermediate semiconductor device in accordance with another embodiment of the present disclosure.
Figure 27:
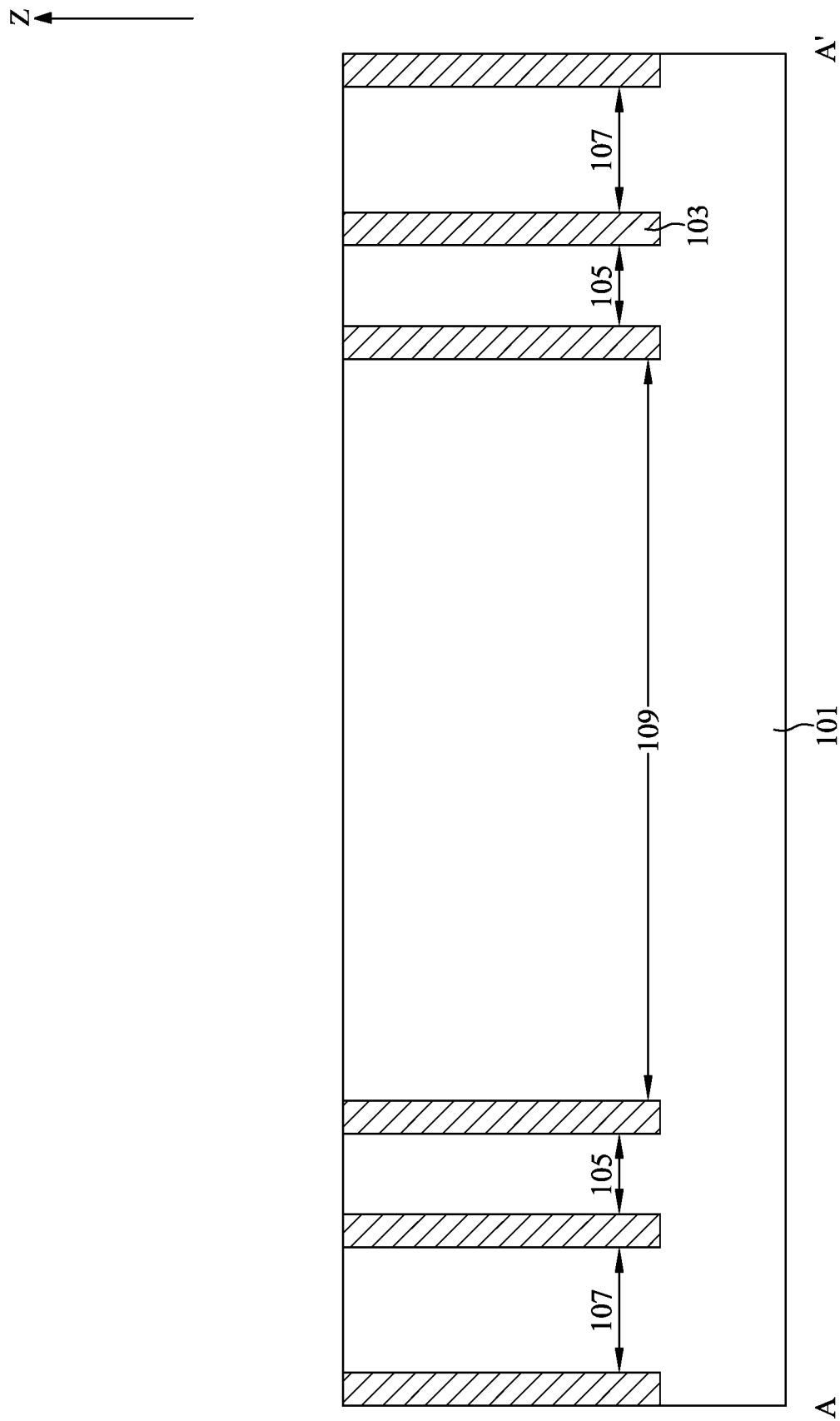
FIG. 27 is a schematic cross-sectional view diagram taken along a line A-A' in FIG. 26.
Figure 28:
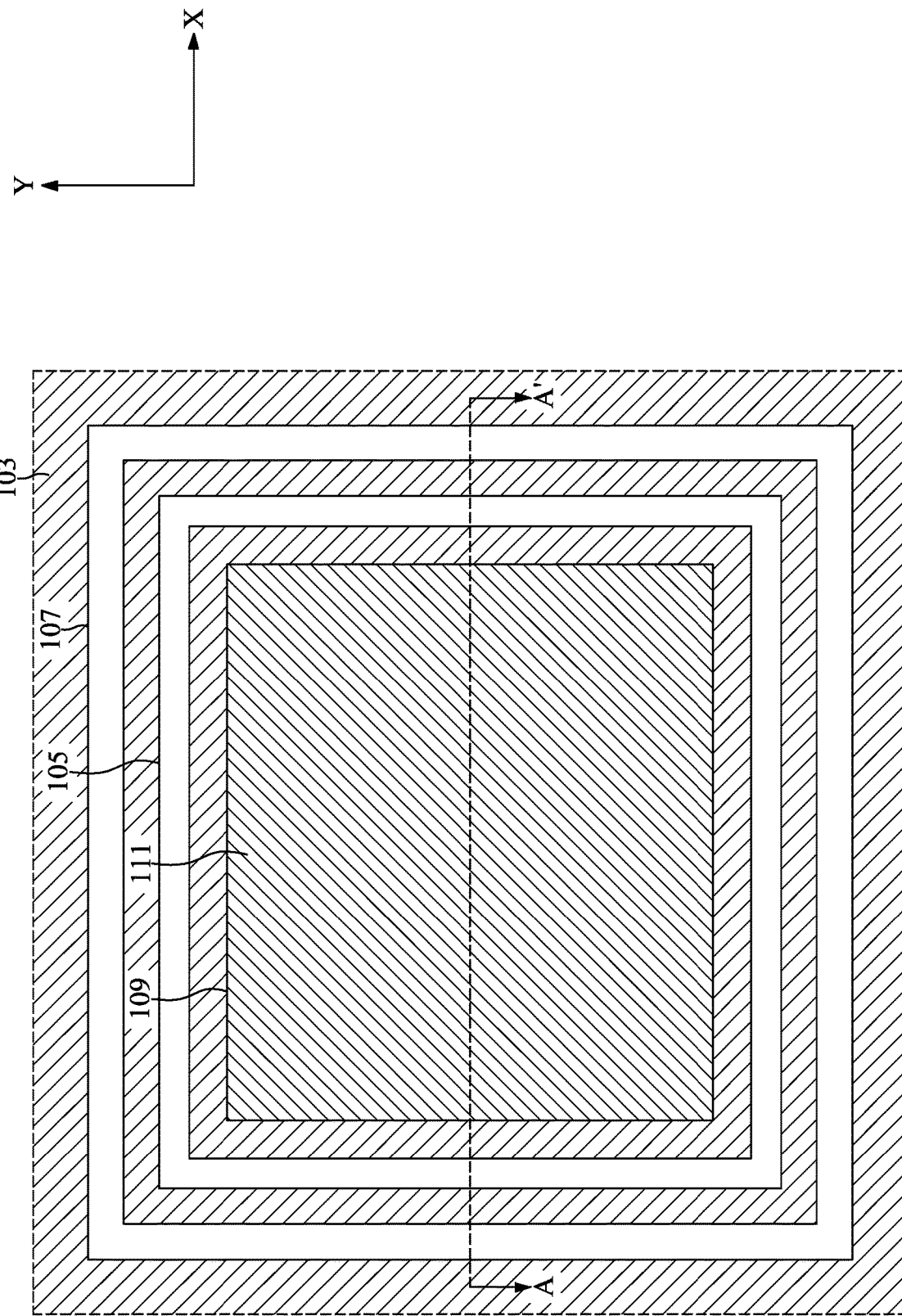
FIG. 28 illustrates, in a schematic top-view diagram, an intermediate semiconductor device in accordance with another embodiment of the present disclosure.
Figure 29:
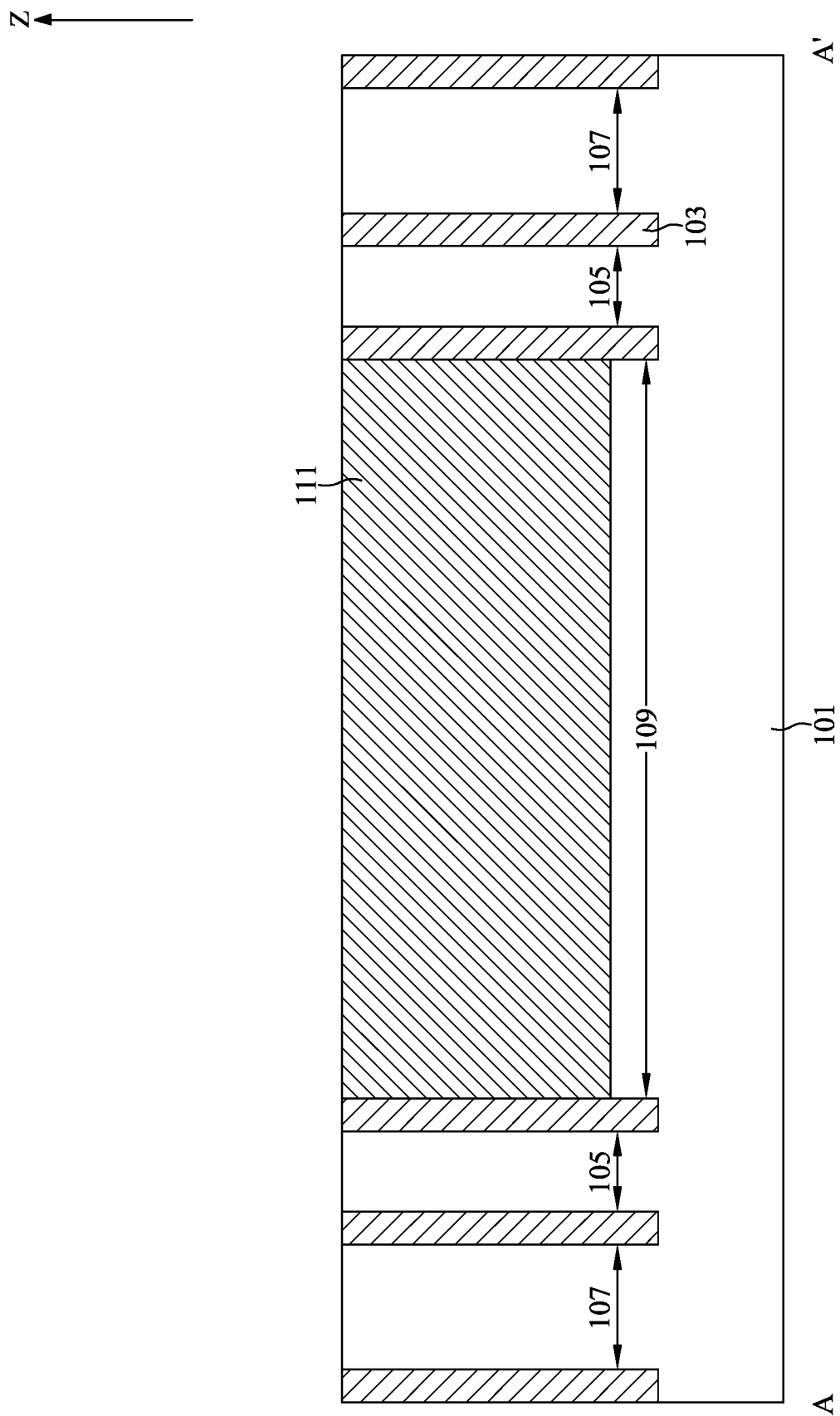
FIG. 29 is a schematic cross-sectional view diagram taken along a line A-A' in FIG. 28.

FIG. 25 illustrates, in a flowchart diagram form, a method 30 for fabricating a semiconductor device 1B in accordance with another embodiment of the present disclosure. FIG. 26 illustrates, in a schematic top-view diagram, an intermediate semiconductor device in accordance with another embodiment of the present disclosure. FIG. 27 is a schematic cross-sectional view diagram taken along a line A-A' in FIG. 26. FIG. 28 illustrates, in a schematic top-view diagram, an intermediate semiconductor device in accordance with another embodiment of the present disclosure. FIG. 29 is a schematic cross-sectional view diagram taken along a line A-A' in FIG. 28.

With reference to FIGS. 26 to 29, at step S31, a substrate 101 may be provided, an isolation layer 103 may be formed in the substrate 101 to define a center area 109, a first surrounding area 105 surrounding the center area 109, and a second surrounding area 107 surrounding the first surrounding area 105, and a well region 111 may be formed in the center area 109.

With reference to FIGS. 26 and 27, the substrate 101 and the isolation layer 103 may be formed with a procedure similar to that illustrated in FIGS. 2 and 3, and descriptions thereof are not repeated herein.

With reference to FIGS. 28 and 29, the well region 111 may be formed with a procedure similar to that illustrated in FIGS. 4 and 5, and descriptions thereof are not repeated herein.

Figure 30:
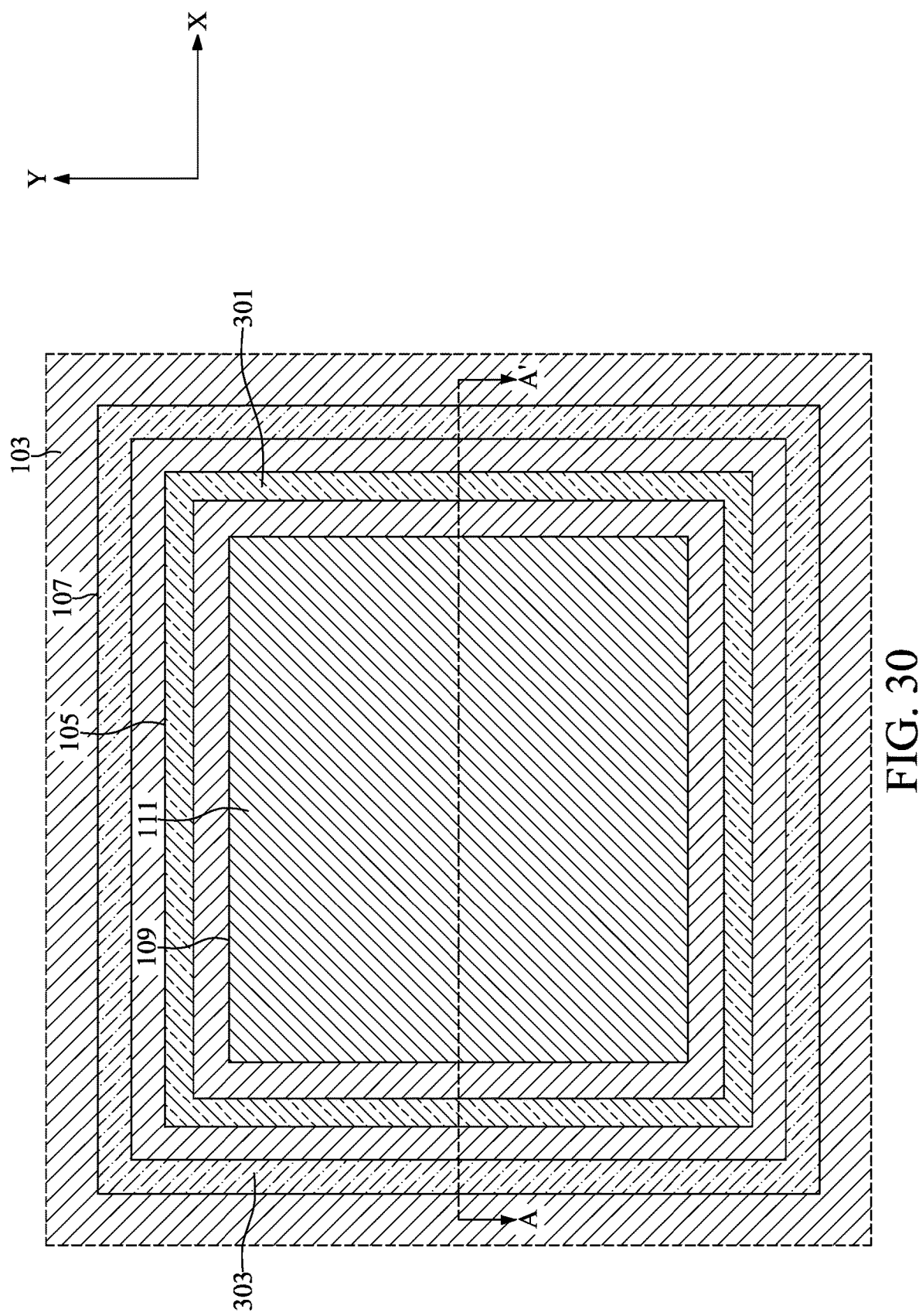
FIG. 30 illustrates, in a schematic top-view diagram, an intermediate semiconductor device in accordance with another embodiment of the present disclosure.
Figure 31:
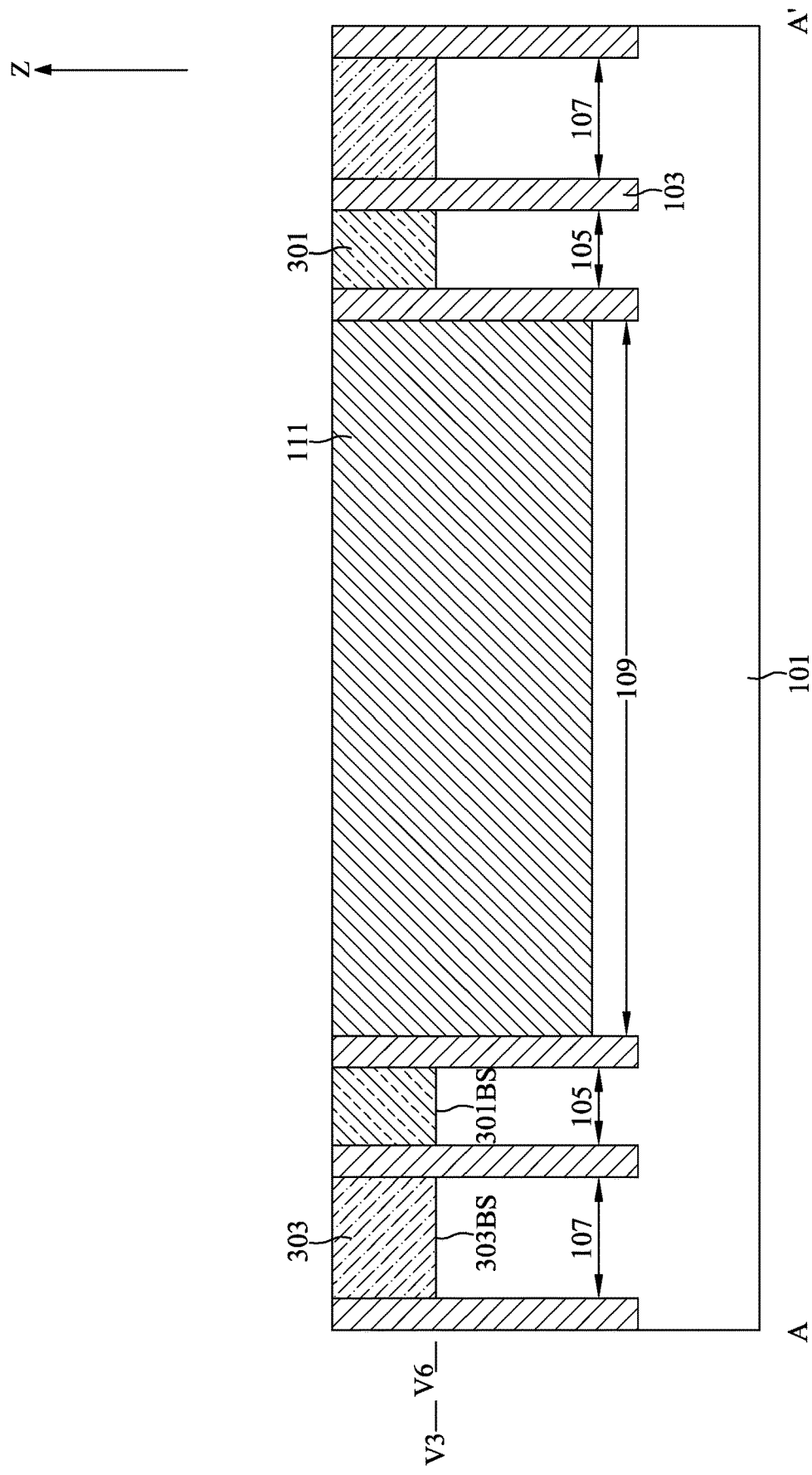
FIG. 31 is a schematic cross-sectional view diagram taken along a line A-A' in FIG. 30.
Figure 32:
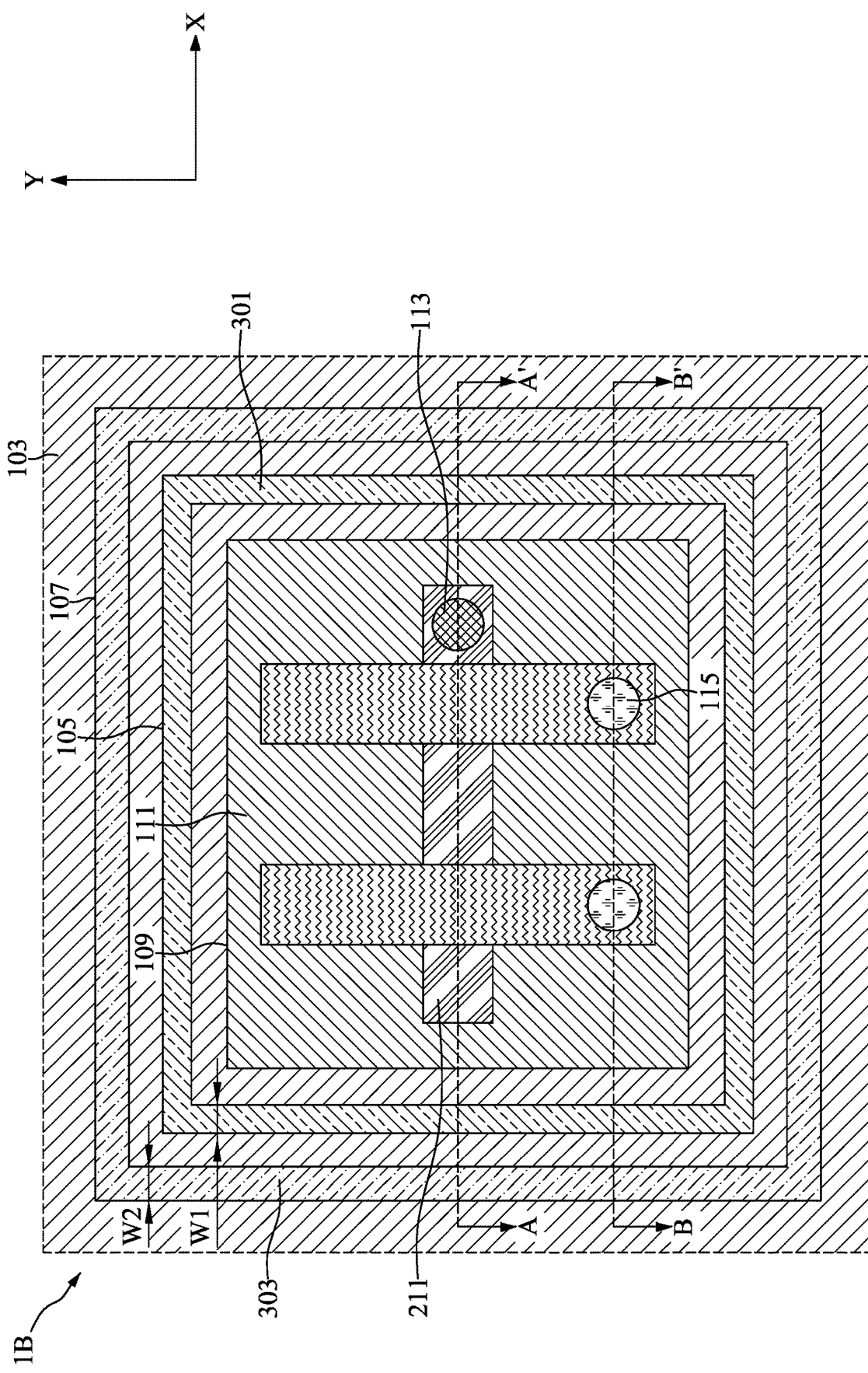
FIG. 32 illustrates, in a schematic top-view diagram, an intermediate semiconductor device in accordance with one embodiment of the present disclosure.
Figure 33:
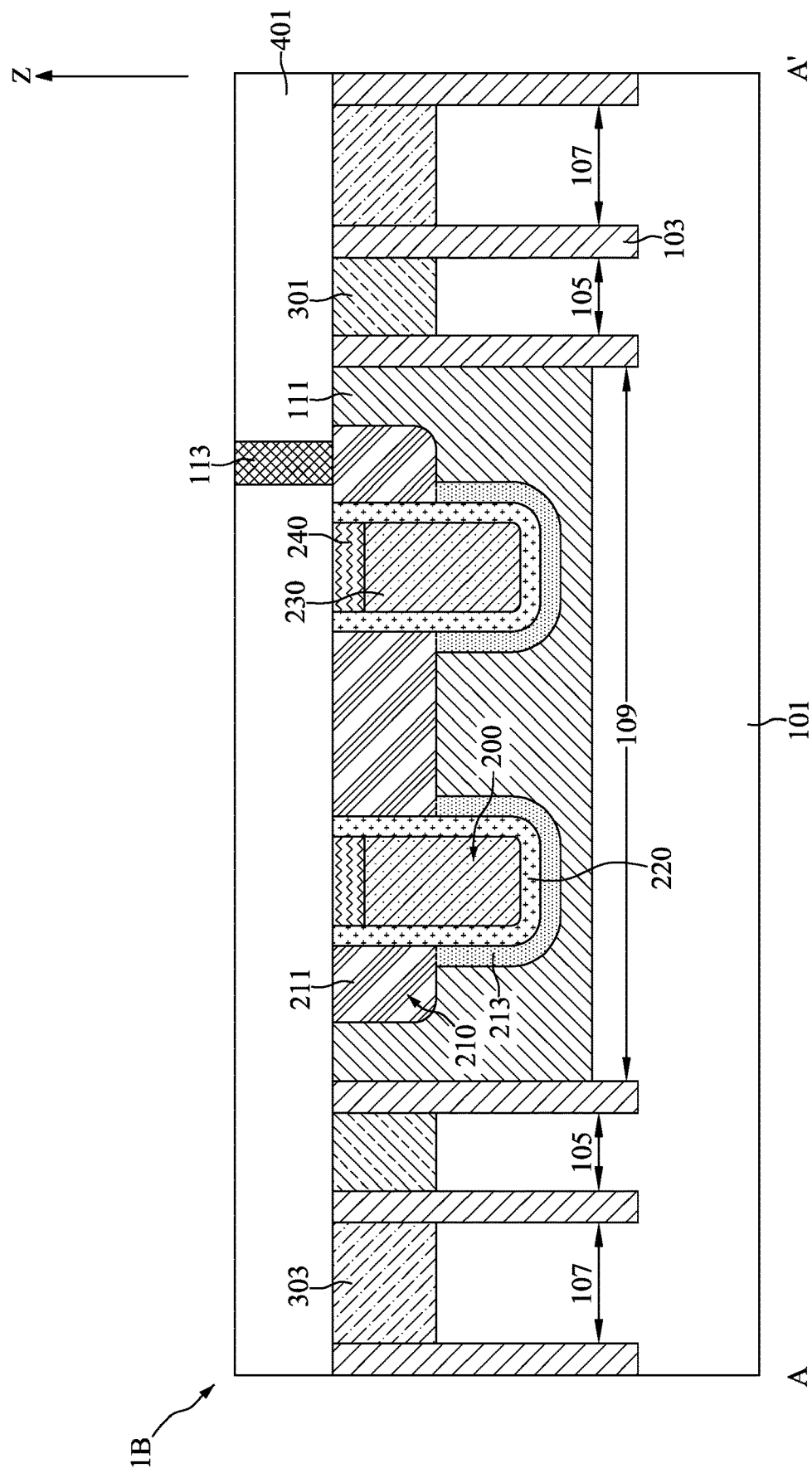
FIGS. 33 and 34 are schematic cross-sectional view diagrams taken along lines A-A' and B-B' in FIG. 32.
Figure 34:
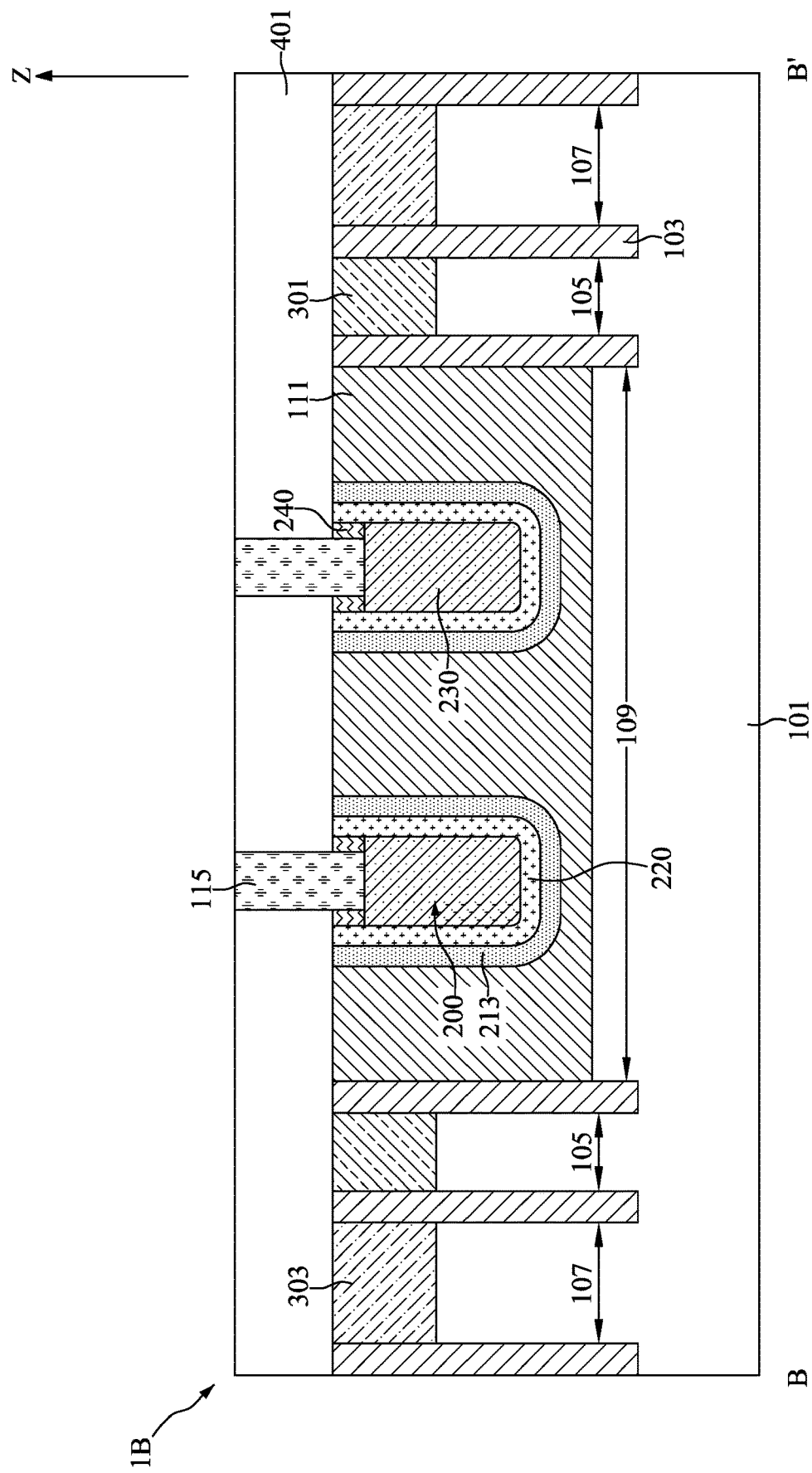

FIG. 30 illustrates, in a schematic top-view diagram, an intermediate semiconductor device in accordance with another embodiment of the present disclosure. FIG. 31 is a schematic cross-sectional view diagram taken along a line A-A' in FIG. 30. FIG. 32 illustrates, in a schematic top-view diagram, an intermediate semiconductor device in accordance with one embodiment of the present disclosure. FIGS. 33 and 34 are schematic cross-sectional view diagrams taken along lines A-A' and B-B' in FIG. 32.

With reference to FIGS. 26, 30, and 31, at step S33, a first guard ring 301 may be formed in the first surrounding area 105 and a second guard ring 303 may be formed in the second surrounding area 107.

With reference to FIGS. 30 and 31, the first guard ring 301 may be formed with a procedure similar to that illustrated in FIGS. 8 and 9, and descriptions thereof are not repeated herein.

With reference to FIGS. 30 and 31, a mask layer (not shown) may be formed on the substrate 101 to expose the second surrounding area 107. An implantation process may be performed to dope the exposed second surrounding area 107 with n-type dopants. After the implantation process, the second guard ring 303 may be formed in the second surrounding area 107. The second guard ring 303 may have the second electrical type (i.e., n-type). In some embodiments, the dopant concentration of the second guard ring 303 may be greater than the dopant concentration of the well region 111. In some embodiments, the dopant concentration of the second guard ring 303 and the dopant concentration of the first guard ring 301 may be substantially the same. In some embodiments, the dopant concentration of the second guard ring 303 and the dopant concentration of the first guard ring 301 may be different. For example, the dopant concentration of the second guard ring 303 may be greater than or less than the dopant concentration of the first guard ring 301.

With reference to FIGS. 30 and 31, the vertical level V3 of the bottom surface 301BS of the first guard ring 301 and the vertical level V6 of the bottom surface 303BS of the second guard ring 303 may be substantially the same. In some embodiments, the vertical level V3 of the bottom surface 301BS of the first guard ring 301 and the vertical level V6 of the bottom surface 303BS of the second guard ring 303 may be different. For example, the vertical level V3 of the bottom surface 301BS of the first guard ring 301 may be greater than or less than the vertical level V6 of the bottom surface 303BS of the second guard ring 303.

With reference to FIGS. 30 and 31, in some embodiments, the width W1 of the first guard ring 301 and the width W2 of the second guard ring 303 may be substantially the same. In some embodiments, the width W1 of the first guard ring 301 and the width W2 of the second guard ring 303 may be different. For example, the width W1 of the first guard ring 301 may be greater than or less than the width W2 of the second guard ring 303.

In some embodiments, an anneal process may be performed to activate the first guard ring 301 and the second guard ring 303. The temperature of the anneal process may be between about 800° C. and about 1250° C. The anneal process may have a process duration between about 1 millisecond and about 500 milliseconds. The anneal process may be, for example, a rapid thermal anneal, a laser spike anneal, or a flash lamp anneal.

With reference to FIG. 26 and FIGS. 32 to 34, at step S35, a plurality of programmable units 200 may be formed in the center area 109, a common contact 113 may be formed on a common layer 211 of the plurality of programmable units 200, and a plurality of first contacts 115 may be formed on a plurality of second electrode layers 230 of the plurality of programmable units 200.

With reference to FIGS. 32 to 34, the common layer 211, the connection layer 213, the middle insulating layer 220, the second electrode layer 230, the capping layer 240, the first dielectric layer 401, the common contact 113, and the first contact 115 may be formed with a procedure similar to that illustrated in FIGS. 6 to 24, and descriptions thereof are not repeated herein.

One aspect of the present disclosure provides a semiconductor device including an isolation layer positioned in a substrate to define a first surrounding area surrounding a center area in a top-view perspective; a first guard ring positioned in the first surrounding area;

and a programmable unit including: a middle insulating layer positioned in the center area and including a U-shaped cross-sectional profile; a first electrode including a common layer positioned on two sides of the middle insulating layer, and a connection layer including a U-shaped cross-sectional profile, positioned on the two sides and the bottom surface of the middle insulating layer, and connecting to the common layer; and a second electrode layer positioned on an inner surface of the middle insulating layer. A bottom surface of the common layer is at a vertical level greater than a vertical level of a bottom surface of the middle insulating layer. The first guard ring and the first electrode include opposite electrical types.

Another aspect of the present disclosure provides a semiconductor device including an isolation layer positioned in a substrate to define a first surrounding area surrounding a center area and a second surrounding area surrounding the first surrounding area in a top-view perspective; a first guard ring positioned in the first surrounding area; a second guard ring positioned in the second surrounding area; a programmable unit including: a middle insulating layer positioned in the center area and including a U-shaped cross-sectional profile; a first electrode including a common layer positioned on two sides of the middle insulating layer, and a connection layer including a U-shaped cross-sectional profile, positioned on the two sides and the bottom surface of the middle insulating layer, and connecting to the common layer; and a second electrode layer positioned on an inner surface of the middle insulating layer. A bottom surface of the common layer is at a vertical level greater than a vertical level of a bottom surface of the middle insulating layer. The first guard ring and the first electrode include opposite electrical types, and the first guard ring and the second guard ring include opposite electrical types.

Another aspect of the present disclosure provides a method for fabricating a semiconductor device including forming an isolation layer in a substrate to define a first surrounding area surrounding a center area and a second surrounding area surrounding the first surrounding area in a top-view perspective; forming a first guard ring in the first surrounding area; forming a second guard ring in the second surrounding area; and forming a programmable unit in the center area and including: a middle insulating layer in the center area and including a U-shaped cross-sectional profile; a first electrode including a common layer on two sides of the middle insulating layer, wherein a bottom surface of the common layer is at a vertical level greater than a vertical level of a bottom surface of the middle insulating layer, and a connection layer including a U-shaped cross-sectional profile, on the two sides and the bottom surface of the middle insulating layer, and connecting to the common layer; and a second electrode layer on an inner surface of the middle insulating layer. The first guard ring and the first electrode includes opposite electrical types, and the first guard ring and the second guard ring includes opposite electrical types.

Due to the design of the semiconductor device of the present disclosure, the first guard ring 301 and the second guard ring 303 may provide capability of electrostatic discharge to the plurality of programmable units 200. As a result, the reliability and performance of the semiconductor device 1A, 1B may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   forming an isolation layer in a substrate to define a first surrounding area surrounding a center area in a top-view perspective;
   forming a first guard ring in the first surrounding area; and
   forming a programmable unit comprising:
      forming a middle insulating layer in the center area and comprising a U-shaped cross-sectional profile;
      forming a first electrode comprising:
         forming a common layer on two sides of the middle insulating layer, wherein a bottom surface of the common layer is at a vertical level greater than a vertical level of a bottom surface of the middle insulating layer; and
         forming a connection layer comprising a U-shaped cross-sectional profile, on the two sides and the bottom surface of the middle insulating layer, and connecting to the common layer; and
      forming a second electrode layer on an inner surface of the middle insulating layer;
   wherein the first guard ring and the first electrode comprise opposite electrical types.

2. The method of claim 1, wherein the first electrode comprises n-type impurities and the first guard ring comprises p-type impurities.

3. The method of claim 2, wherein a vertical level of a bottom surface of the first guard ring and the vertical level of the bottom surface of the common layer are substantially the same.

4. The method of claim 2, wherein a vertical level of a bottom surface of the first guard ring and the vertical level of the bottom surface of the common layer are different.

5. The method of claim 2, wherein forming the programmable unit comprises forming a capping layer on the second electrode layer.

6. The method of claim 5, further comprising:
forming a common contact on the common layer;
forming a first contact along the capping layer and on the second electrode layer; and
forming a well region in the center area, wherein the programmable unit is in the well region.

7. The method of claim 6, wherein the well region comprises n-type impurities.

8. The method of claim 6, wherein the well region comprises p-type impurities.

9. A method for fabricating a semiconductor device, comprising:
forming an isolation layer in a substrate to define a first surrounding area surrounding a center area and a second surrounding area surrounding the first surrounding area in a top-view perspective;
forming a first guard ring in the first surrounding area;
forming a second guard ring in the second surrounding area;
forming a programmable unit comprising:
forming a middle insulating layer in the center area and comprising a U-shaped cross-sectional profile;
forming a first electrode comprising:
forming a common layer on two sides of the middle insulating layer, wherein a bottom surface of the common layer is at a vertical level greater than a vertical level of a bottom surface of the middle insulating layer; and
forming a connection layer comprising a U-shaped cross-sectional profile, on the two sides and the bottom surface of the middle insulating layer, and connecting to the common layer; and
forming a second electrode layer on an inner surface of the middle insulating layer;
wherein the first guard ring and the first electrode comprise opposite electrical types, and the first guard ring and the second guard ring comprise opposite electrical types.

10. The method of claim 9, wherein the first electrode comprises n-type impurities, the first guard ring comprises p-type impurities, and the second guard ring comprises n-type impurities.

11. The method of claim 10, wherein a vertical level of a bottom surface of the first guard ring and the vertical level of the bottom surface of the common layer are substantially the same.

12. The method of claim 10, wherein a vertical level of a bottom surface of the first guard ring and the vertical level of the bottom surface of the common layer are different.

13. The method of claim 10, wherein forming the programmable unit comprises forming a capping layer on the second electrode layer.

14. The method of claim 13, further comprising:
forming a common contact on the common layer;
forming a first contact along the capping layer and on the second electrode layer; and
forming a well region in the center area, wherein the programmable unit is in the well region.

15. The method of claim 14, wherein the well region comprises n-type impurities.

16. The method of claim 14, wherein the well region comprises p-type impurities.

17. The method of claim 14, wherein the vertical level of the bottom surface of the first guard ring and a vertical level of a bottom surface of the second guard ring are substantially the same.

18. The method of claim 14, wherein the vertical level of the bottom surface of the first guard ring and a vertical level of a bottom surface of the second guard ring are different.

19. The method of claim 18, wherein a width of the first guard ring and a width of the second guard ring are substantially the same.

20. The method of claim 14, wherein a width of the first guard ring and a width of the second guard ring are different.

21. The method of claim 18, wherein a width of the first surrounding area is less than a distance between the first surrounding area and the center area.

* * * * *